(12) United States Patent
Hasegawa et al.

(10) Patent No.: US 7,221,690 B2
(45) Date of Patent: May 22, 2007

(54) SEMICONDUCTOR LASER AND PROCESS FOR MANUFACTURING THE SAME

(75) Inventors: Yoshiaki Hasegawa, Katano (JP); Toshiya Yokogawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 99 days.

(21) Appl. No.: 10/643,944

(22) Filed: Aug. 20, 2003

(65) Prior Publication Data
US 2004/0179563 A1    Sep. 16, 2004

(51) Int. Cl.
*H01S 3/04* (2006.01)
(52) U.S. Cl. .................. 372/43.01; 372/46.01
(58) Field of Classification Search ............. 372/43, 372/46, 43.01, 46.01
See application file for complete search history.

(56) References Cited

U.S. PATENT DOCUMENTS

| 5,345,463 | A | | 9/1994 | Mannoh et al. |
| 5,903,017 | A | * | 5/1999 | Itaya et al. ............... 257/190 |
| 5,959,307 | A | * | 9/1999 | Nakamura et al. ......... 257/14 |
| 6,111,277 | A | * | 8/2000 | Ikeda ........................ 257/99 |
| 6,580,736 | B1 | * | 6/2003 | Yoshie et al. ............. 372/45 |
| 6,711,191 | B1 | * | 3/2004 | Kozaki et al. ........... 372/43.01 |
| 2003/0091085 | A1 | * | 5/2003 | Northrup et al. ............. 372/50 |

FOREIGN PATENT DOCUMENTS

| JP | 4-275479 A | 10/1992 |
| JP | 5-291686 | 11/1993 |
| JP | 6-283825 A | 10/1994 |
| JP | 10-200214 A | 7/1998 |
| JP | 11-251687 | 9/1999 |
| JP | 11251687 A | * 9/1999 |
| JP | 2000-21789 | 1/2000 |
| JP | 2001-36196 | 2/2001 |
| JP | 2001-332815 | 11/2001 |

OTHER PUBLICATIONS

Tojyo, Tsuyoshi., et al. "GaN based High Power Blue Violet Laser Diodes." The Japan Society for Applied Physlcs, vol. 40. Pad 1. No. 5A, May 2001, pp. 3206-3210.*
Goto, S., et al. "InGaN: Improvement of quantum efficiency by InGaN interlayer for blue-violet laser diodes." Sony Shiroishi Semiconductor Inc. 28p-E-12, p. 369.

(Continued)

*Primary Examiner*—Minsun Oh Harvey
*Assistant Examiner*—Tod T. Van Roy
(74) *Attorney, Agent, or Firm*—McDermott Will & Emery LLP

(57) ABSTRACT

This specification relates to a semiconductor laser in which an n-type semiconductor layer (13), an active layer (101), and a p-type semiconductor layer (24) are stacked in this order on a substrate (11), the active layer (101) comprising a well layer composed of InGaN, the semiconductor laser comprising an intermediate layer (21) sandwiched between the active layer (101) and the p-type semiconductor layer (24), and the intermediate layer including no intentionally added impurities and being composed of a gallium nitride-based compound semiconductor. This semiconductor laser has an extended lifetime under high optical output power conditions.

8 Claims, 18 Drawing Sheets

OTHER PUBLICATIONS

Nakamura, Shuji. "InGaN Multiquantum-Well-Structure Laser Diodes with GaN—AlGaN Modulation -Doped Strained-Layer Superlattices." IEEE Journal of Selected Topics in Quantum Electronics, vol. 4, No. 3, May/Jun. 1998, pp. 483-489.

Kneissl, Michael., et al. "Performance and degradation of continuous-wave InGaN multiple-quantum-well laser diodes on epitaxially laterally overgrown GaN substrates." Applied Physics Letters, vol. 77, No. 13, Sep. 25, 2000, pp. 1931-1933.

Nakamura, Shuji., et al. "UV/Blue/Green InGaN-Based LEDs and Laser Diodes Grown on Epitaxially Laterally Overgrown GaN." IEICE Trans. Electron., vol. E83-C, No. 4, Apr. 2000, pp. 529-535.

Tojyo, Tsuyoshi., et al. "GaN-Based High Power Blue-Violet Laser Diodes." The Japan Society for Applied Physics, vol. 40, Part 1. No. 5A, May 2001, pp. 3206-3210.

Kuroda, Naotaka., et al. "Precise control of pn-junction profiles for GaN-based LD structures using GaN substrates with low dislocation densities." Journal of Crystal Growth 189/190 (1998) pp. 551-555.

Ohba, Y., et al A study on strong memory effects for Mg doping GaN metalorganic chemical vapor deposition. Journal of Crystal growth 145 (1994) pp. 214-218.

Blaauw, C., et al. "Secondary ion mass spectrometry and electrical characterization of Zn diffusion in n-type InP." J. Appl. Phys. 66(2), Jul. 15, 1989, American Institute of Physics, pp. 605610.

Chinese Office Action issued in corresponding Chinese Patent Application No. CN 03805468X, dated Jul. 21, 2006.

* cited by examiner

SEMICONDUCTOR LASER AND PROCESS FOR MANUFACTURING THE SAME

TECHNICAL FIELD

The present invention relates to a semiconductor laser and a process for manufacturing the same.

BACKGROUND ART

Due to the growing demand for violet-light-emitting laser diodes for use as a light source for next-generation high-density optical discs, Group III-V compound semiconductor light-emitting devices, especially those of gallium nitride (GaN)-based compounds that are operable in the short wavelength region of violet-ultraviolet light, have been actively researched and developed in recent years. Further, high-density and high-speed recording capabilities are desired for optical disc devices for use as a recorder, thus creating a demand for highly reliable GaN-based semiconductor lasers with high optical output power.

A technique that has been used recently for extending the lifetime of GaN-based lasers involves partially disposing an insulating film, such as one of silicon dioxide ($SiO_2$), on a GaN-based semiconductor film grown on a sapphire substrate and then selectively growing GaN-based semiconductors on the insulating film, thereby reducing the dislocation density. This process of selective growth is described, for example, in Publication No. 1, "IEEE Journal of Selected Topics in Quantum Electronics, Vol. 4 (1998): 483–489". Based on this publication, an $SiO_2$ film is formed in such a manner as to form a periodic line-and-space pattern in the GaN <1–100> direction, so that the GaN film grown above the $SiO_2$ film in the lateral direction (ELO: Epitaxial Lateral Overgrowth) joins to form a flat surface, thereby producing a substrate with low dislocation density.

Such an ELO selective growth technique is applied to lasers, as is reported, for example, in Publication No. 2, "Applied Physics Letters, Vol. 77 (2000): 1931–1933", and Publication No. 3, "IEICE Transaction Electron, Vol. E83-C (2000): 529–535". Publication No. 2 explains that the dislocation density in the active layer part of the laser structure was reduced from about $1E10$ cm$^{-2}$ to about $1E7$ cm$^{-2}$ by using a selective growth technique. Further, based on Publication No. 4, "Japanese Journal of Applied Physics, Vol. 40 (2001): 3206–3210", reductions in the operating current and operating voltage of GaN-based lasers reduce the power consumption (i.e., the product of operating current and operating voltage) and thus may prevent the lasers from generating heat, thereby effectively helping to extend the lifetime of the lasers.

Semiconductor lasers, including GaN-based lasers, commonly have a structure in which an active layer is sandwiched between two pn-junction-forming layers for the purpose of carrier injection. Hence, the control of p-type and n-type dopants in the vicinity of the active layer, i.e., the interface abruptness, is important for improving the laser characteristics because the above dopants, if diffused into the active layer, may act as non-radiative recombination centers and may therefore lead to a reduction in the luminous efficiency of the active layer. Described below is a conventional method employed for controlling p-type dopants in GaN-based semiconductors.

Biscyclopentadienylmagnesium ($Cp_2Mg$) is generally used as a p-type dopant for GaN. However, Publication No. 5, "Journal of Crystal Growth, Vol. 189/190 (1998): 551–555", points out the problem that, in crystal growth by metal organic vapor phase epitaxy (MOVPE), Mg p-type dopants diffuse to areas other than the desired crystals. This publication also mentions that the unwanted diffusion is more distinctly observed when the dislocation density is high. Publication No. 6, "Journal of Crystal Growth, Vol. 145 (1994): 214–218", cites the memory effect from Mg adhering to the quartz reactor of the MOVPE apparatus. According to this publication, the memory effect of Mg causes a doping delay that degrades the interface abruptness in the Mg concentration distribution.

Other conventional methods used for controlling Mg diffusion are described, for example, in the Japanese Unexamined Patent Publication No. 1994-283825 and the Japanese Patent Unexamined Publication No. 1999-251687.

We attempted to reduce the dislocation density of a GaN film by ELO selective growth with the intention of extending the lifetime of GaN-based lasers, in much the same way as the above Publication Nos. 1 and 2, but did not obtain satisfactory results in terms of extending lifetime. It was found accordingly that the lifetime of GaN-based lasers could not be sufficiently extended only by reducing the dislocation density.

DISCLOSURE OF THE INVENTION

An object of the present invention is to provide a semiconductor laser that is capable of an extended lifetime under high optical output power conditions, and a process for manufacturing the same.

The above object of the present invention is achieved by a semiconductor laser in which an n-type semiconductor layer, an active layer and a p-type semiconductor layer are stacked in this order on a substrate, the active layer comprising a well layer composed of InGaN, the semiconductor laser comprising an intermediate layer sandwiched between the active layer and the p-type semiconductor layer, and the intermediate layer including no intentionally added impurities and being composed of a gallium nitride-based compound semiconductor.

The above semiconductor laser is fabricated, for example, by a process comprising the steps of forming on a substrate an n-type semiconductor layer doped with an n-type impurity, forming on the n-type semiconductor layer an active layer comprising a well layer composed of InGaN, forming on the active layer an intermediate layer composed of a gallium nitride-based compound, and forming on the intermediate layer a p-type semiconductor layer doped with a p-type impurity, wherein the intermediate layer is formed without being doped with any impurities.

The above object of the present invention is also achieved by a semiconductor laser in which an n-type semiconductor layer, an active layer, and a p-type semiconductor layer are stacked in this order on a substrate, the semiconductor laser comprising an intermediate layer sandwiched between the active layer and the p-type semiconductor layer and composed of a gallium nitride-based compound semiconductor, the intermediate layer having a stacked structure comprising an undoped layer including no intentionally added impurities and a diffusion-blocking layer doped with an n-type impurity, and the diffusion-blocking layer being located at a side adjacent to the p-type semiconductor layer.

The above semiconductor laser is fabricated, for example, by a process comprising the steps of forming on a substrate an n-type semiconductor layer doped with an n-type impurity, forming on the n-type semiconductor layer an active layer comprising a well layer composed of InGaN, forming on the active layer an intermediate layer composed of a gallium nitride-based compound, and forming on the intermediate layer a p-type semiconductor layer doped with a p-type impurity, wherein the step of forming the intermediate layer comprises the steps of growing a gallium nitride-based compound semiconductor layer without adding any impurities, thereby forming an undoped layer including no intentionally added impurities, and starting to add an n-type impurity in the course of the growth of the gallium nitride-based compound semiconductor layer, thereby forming a diffusion-blocking layer.

It is preferable that the above step of forming the n-type semiconductor layer on the substrate be performed after selectively growing a nitride-based compound semiconductor layer in the lateral direction on the substrate.

BEST MODE FOR CARRYING OUT THE INVENTION (First Embodiment)

Figure 1:
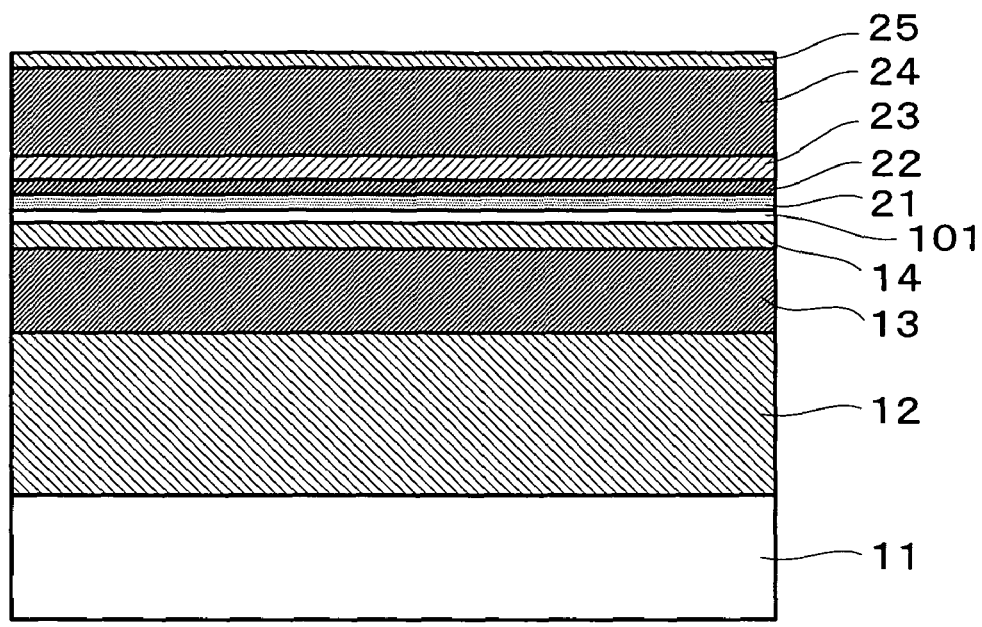
FIG. 1 is a cross-sectional view of a laser wafer constituting a semiconductor laser according to the first embodiment of the present invention.
Figure 2:
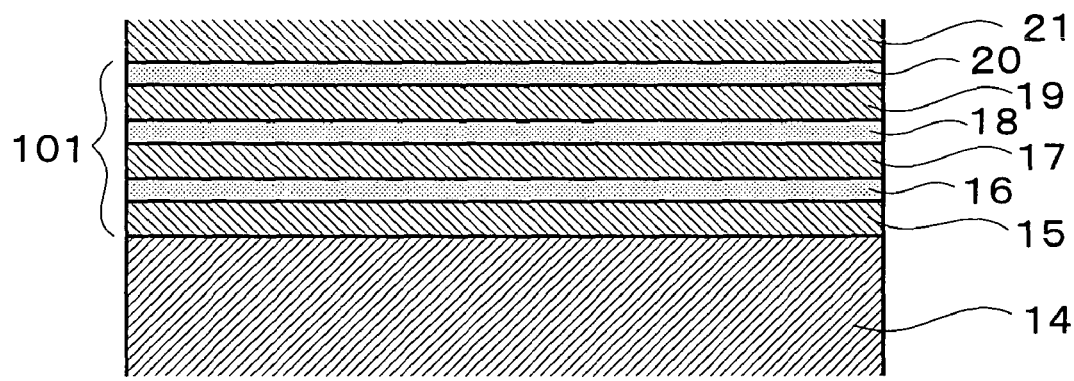
FIG. 2 is a partial cross-sectional view of FIG. 1.

FIGS. 1 and 2 are cross-sectional views of a laser wafer constituting a semiconductor laser according to the first embodiment of the present invention. As illustrated in FIG. 1, the laser wafer is configured such that an n-type contact layer 12, an n-type cladding layer 13, a first optical guiding layer 14, a multiple quantum well active layer 101, an intermediate layer 21, a cap layer 22, a second optical guiding layer 23, a p-type cladding layer 24 and a p-type contact layer 25 are stacked in this order on a sapphire substrate 11, meaning that an active layer is sandwiched between an n-type semiconductor layer, which is doped with an n-type impurity, and a p-type semiconductor layer, which is doped with a p-type impurity. The p-type impurity to be used is preferably one with a high rate of electrical activation, and is Mg in the present embodiment. The n-type impurity to be used is preferably one with excellent controllability for electrical conductivity, and is Si in the present embodiment.

As illustrated in FIG. 2, the multiple quantum well active layer 101 is configured such that a first GaN barrier layer 15, a first $In_{0.1}Ga_{0.9}N$ quantum well 16, a second GaN barrier layer 17, a second $In_{0.1}Ga_{0.9}N$ quantum well 18, a third GaN barrier layer 19 and a third $In_{0.1}Ga_{0.9}N$ quantum well 20 are stacked in this order from the optical guiding layer 14 side.

The above laser wafer may be manufactured by the process described below: First, the sapphire substrate 11, whose (0001) face is the main face, is washed using an acid solution. The substrate 11 is then placed on a susceptor in the reaction chamber of the MOVPE appratus (omitted from the drawing), after which the reaction chamber is evacuated. Subsequently, the inside of the reaction chamber is controlled to produce a hydrogen atmosphere with a pressure of 300 Torr (1 Torr=133.322 Pa) and heated to a temperature of about 1,100° C., and then the substrate 11 is heated therein for 10 minutes for thermal cleaning of the surface.

After lowering the temperature in the reaction chamber to about 500° C., 7 sccm of trimethylgallium (TMG), 7.5 slm of ammonia ($NH_3$) gas, and hydrogen as a carrier gas are provided simultaneously above the main surface of the substrate 11, thereby growing a low-temperature buffer layer of GaN (omitted from the drawing), having a thickness of 20 nm. Successively, the temperature inside the reaction chamber is raised to about 1,000° C. and, thereafter, silane ($SiH_4$) gas as an n-type dopant is further supplied, thereby growing the n-type contact layer 12 of n-type GaN, having a thickness of about 4 μm and an Si impurity concentration of about $1E18$ $cm^{-3}$. After this, trimethylaluminum (TMA) is further supplied, thereby growing the n-type cladding layer 13 of n-type $Al_{0.07}Ga_{0.93}N$, having a thickness of about 0.7 μm and an Si impurity concentration of about $5E17$ $cm^{-3}$. Successively, the first optical guiding layer 14 of n-type GaN is grown, which has a thickness of about 120 nm and an Si impurity concentration of about 1E18 cm$^{-3}$.

Then, after raising the temperature to about 800° C., the carrier gas is switched from hydrogen to nitrogen and, further, trimethylindium (TMI) and TMG are supplied, thereby growing the multiple quantum well active layer 101, which is composed of the quantum wells 16, 18 and 20 of $In_{0.1}Ga_{0.9}N$ (three layers), each having a thickness of about 3 nm, and the barrier layers 15, 17 and 19 of GaN (three layers), each having a thickness of about 9 nm, as shown in FIG. 2. In order to improve the luminous efficiency of the active layer 101, $SiH_4$ gas is also supplied while the barrier layers are grown such that only the barrier layers are doped with Si to an Si impurity concentration of about 2E18 cm$^{-3}$.

Thereafter, the intermediate layer 21 of GaN is grown, which has a thickness of about 15 nm (0.015 μm). According to the present embodiment, the intermediate layer 21 is substantially an undoped layer, which is intentionally kept from impurity doping.

After again raising the temperature inside the reaction chamber to about 1,000° C., the carrier gas is switched back from nitrogen to hydrogen and, further, $Cp_2Mg$ gas as a p-type dopant is supplied, thereby growing the cap layer 22 of p-type $Al_{0.18}Ga_{0.82}N$, having a thickness of about 20 nm and an Mg impurity concentration of about 1E19 cm$^{-3}$. Then, the second optical guiding layer 23 of p-type GaN is grown, which has a thickness of about 120 nm and an Mg impurity concentration of about 1E19 cm$^{-3}$. Next, the p-type cladding layer 24 of p-type $Al_{0.07}Ga_{0.93}N$ is grown, which has a thickness of about 0.5 μm and an Mg impurity concentration of about 1E19 cm$^{-3}$. Finally, the p-type contact layer 25 of p-type GaN, having a thickness of about 0.05 μm and an Mg impurity concentration of about 1E19 cm$^{-3}$, is grown, whereby the laser wafer is obtained, in which the intermediate layer 21 and the active layer 101 are sandwiched between the p-type semiconductor layer and the n-type semiconductor layer.

Figure 3:
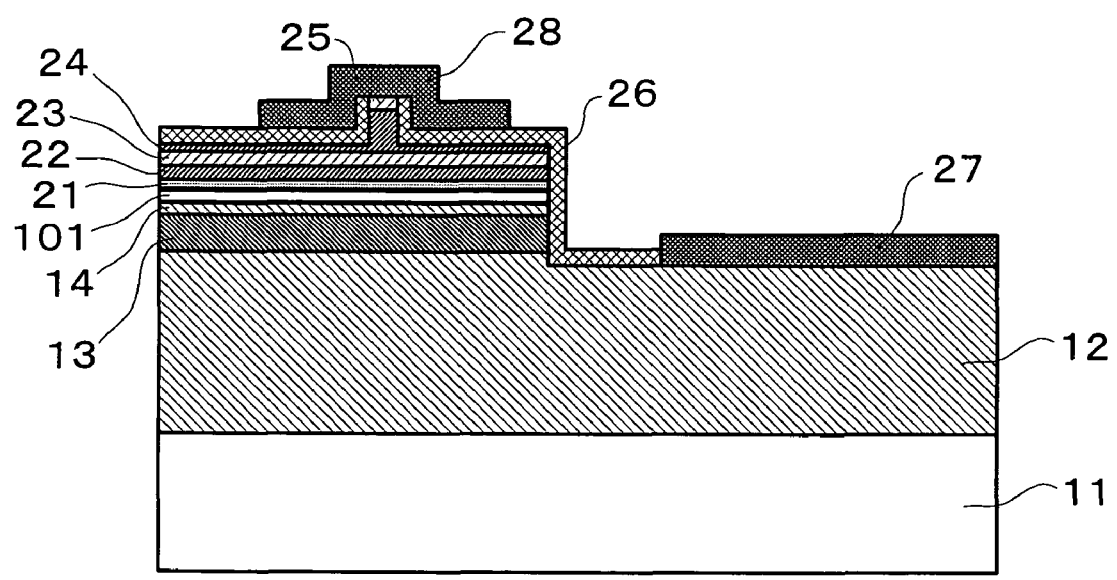
FIG. 3 is a cross-sectional view of the semiconductor laser according to the first embodiment of the present invention.

Described next is a process by which the semiconductor laser shown in FIG. 3 is manufactured using the laser wafer shown in FIGS. 1 and 2.

To start, the p-type semiconductor layer of the laser wafer is subjected to a thermal activation process. Then, an insulating film of silicon dioxide ($SiO_2$) is deposited on the surface of the wafer, and then a resist film is deposited thereon. The resist film is then patterned by photolithography so that it remains only in the ridge-forming portion (ridge width: about 2 μm) of the p-type contact layer 25. After this, by using the resist film as an etching mask, the portion of the insulating film from which the resist was removed is etched using a hydrofluoric acid solution to thereby expose the p-type contact layer 25. Successively, the p-type contact layer 25, excluding the ridge-forming portion thereof, and part of the p-type cladding layer 24 are etched by a dry-etching apparatus such that the remaining thickness of the p-type semiconductor layer is about 0.1 μm. The resist film formed above the ridge is then removed using an organic solution, such as acetone.

Next, the areas other than the portion for forming an n-type electrode are covered with an insulating film of $SiO_2$, and the n-type contact layer 12 is exposed by dry etching. Then, after forming an insulating film 26 of $SiO_2$ on the surface to electrically isolate the p and n sides from each other, the insulating film formed above the p-type contact layer 25 in the ridge portion is removed using a hydrofluoric acid solution. Thereafter, on the exposed area in the n-type contact layer 12, an n-type electrode 27 is formed by vapor deposition of titanium (Ti) and aluminum (Al), while on the exposed area in the p-type contact layer 25, a p-type electrode 28 is formed by vapor deposition of Nickel (Ni), platinum (Pt) and Gold (Au), whereby the semiconductor laser depicted in FIG. 3 is produced.

Next, a cleaving process is performed for the laser resonator end faces. First, the rear side of the sapphire substrate 11 is polished so as to yield a total film thickness of about 100 μm. Thereafter, the substrate 11 is cleaved into bars using a cleaver (omitted from the drawing) such that the resonator end faces are in the <1–100> direction of the sapphire substrate. According to the present embodiment, the length of the laser resonator is 750 μm. Then, a dielectric multilayer film composed of three combinations of $SiO_2$ and titanium dioxide ($TiO_2$) is deposited on the rear end face of the laser resonator, thus giving a high reflective coating.

As a final step, the cleaved bars are cleaved a second time to separate them into laser chips. The laser chip thus obtained is mounted p-side down into a CAN-type laser package by soldering it to a submount of silicon carbide (SiC), whereby a semiconductor laser device is produced.

Figure 4:
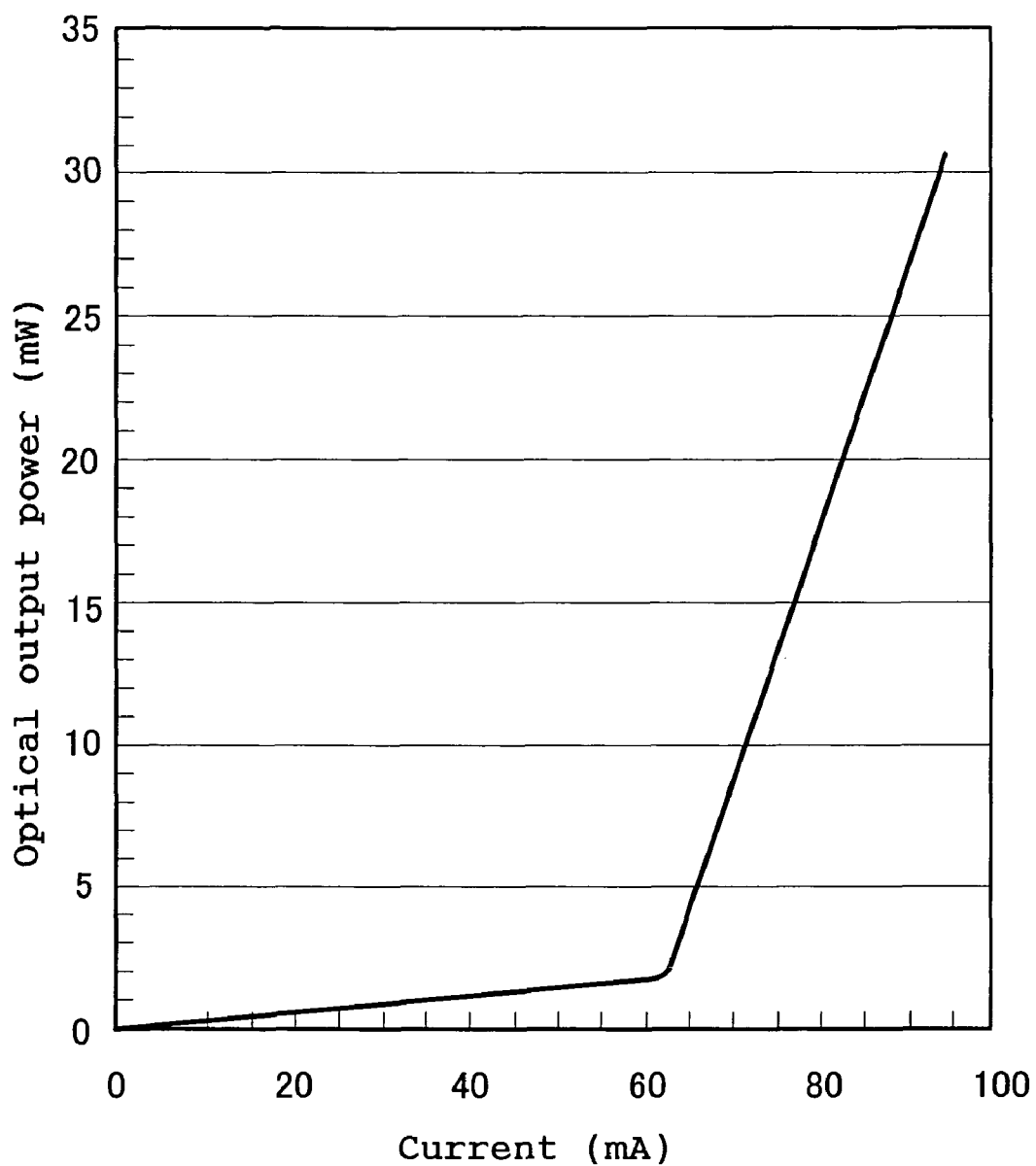
FIG. 4 is a diagram showing the variation of optical output power with respect to current for a semiconductor laser device according the first embodiment of the present invention.

The semiconductor laser device of the present embodiment achieved room-temperature continuous-wave lasing by current injection. The threshold current and slope efficiency were 60 mA and 0.8 W/A, respectively, as indicated in FIG. 4.

Figure 5:
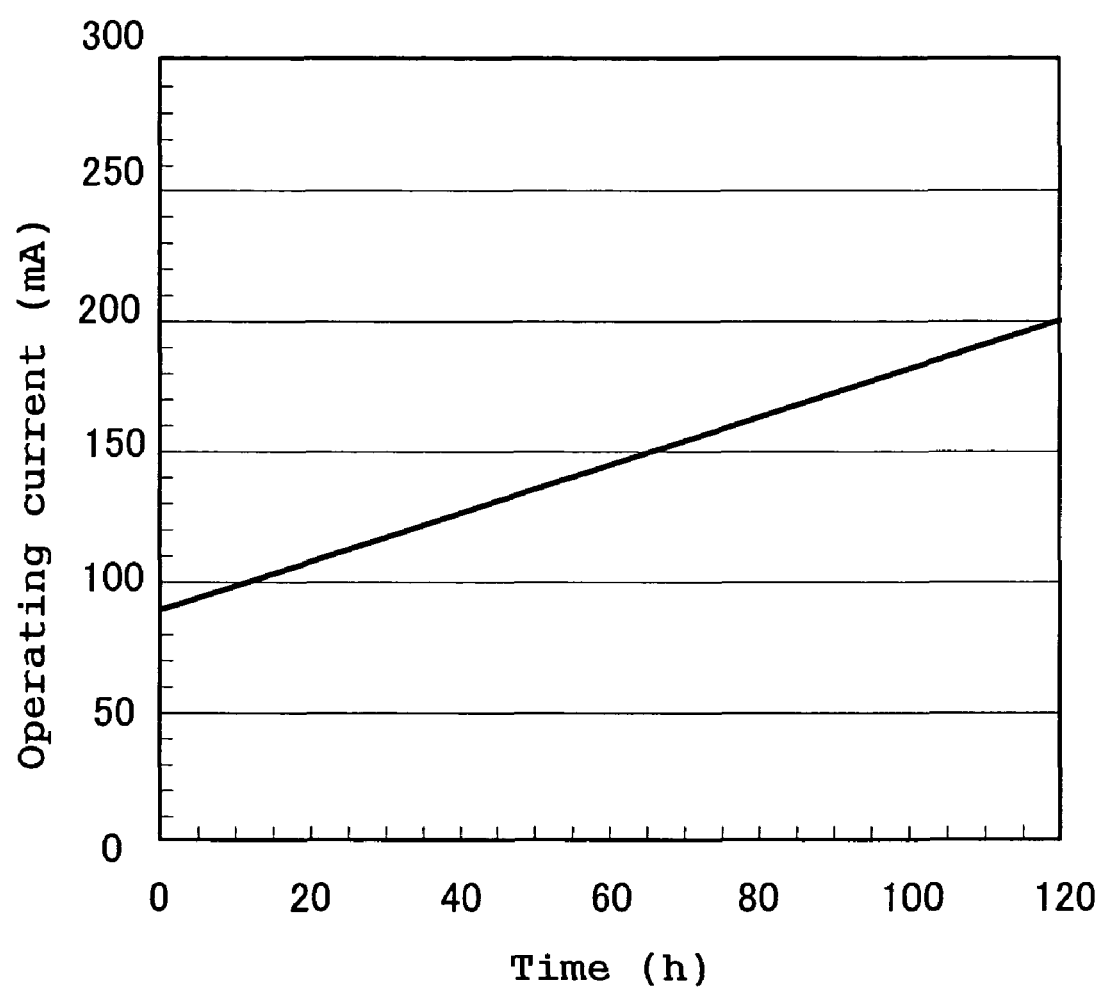
FIG. 5 is a diagram showing the variation of operating current with respect to operating time for the semiconductor laser device according the first embodiment of the present invention.

As a lifetime test, a laser device whose power consumption (i.e., the product of the operating current and the operating voltage) is about 0.6 W at an optical output power of 30 mW was selected and operated at a constant optical output power (APC: Automatic Power Control) as high as 30 mW at room temperature, the results of which are plotted in FIG. 5. According to the results of this test, the deterioration rate (i.e., the rate of increase in operating current) was about 0.9 mA per hour and the lifetime (i.e., the elapsed time until the initial operating current had doubled) was about 100 hours.

According to the present embodiment, the intermediate layer is composed of GaN, which is a binary mixed crystal. However, other gallium nitride-based compound semiconductors are also possible, including ternary mixed crystals, such as AlGaN or InGaN, and quaternary mixed crystals, such as AlInGaN. In addition, while Group III-V nitride semiconductor lasers have been explained in the present embodiment, Group III-V semiconductor lasers that comprise GaAs or InP and Group II-VI semiconductor lasers that comprise ZnSe may also be configured in the same manner as in the present embodiment.

COMPARATIVE EXAMPLE

To give a comparative example vis-à-vis the semiconductor laser of the first embodiment, a semiconductor laser was fabricated in the same manner as in the first embodiment except that the intermediate layer 21 was doped with Si, thus making it an n-type GaN layer. The resulting semiconductor laser was compared with the semiconductor laser of the first embodiment in terms of the profile of Mg diffusion into the active layer. The Si impurity concentration in the intermediate layer of n-type GaN was controlled to be about 2E18 cm$^{-3}$, thus making it almost the same as that in the barrier layer.

Figure 6:
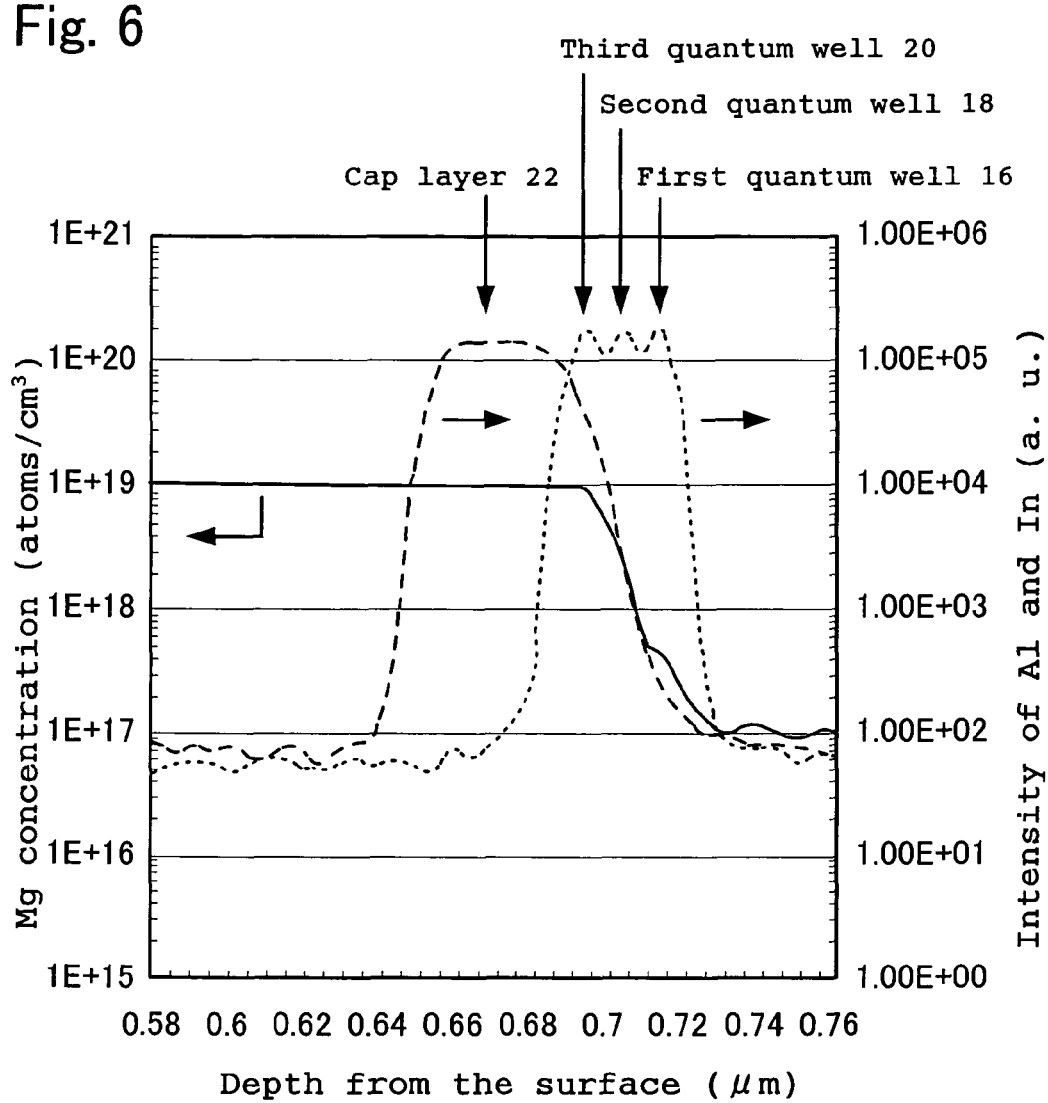
FIG. 6 is a diagram showing the profile of Mg diffusion into an active layer of a laser wafer according to the Comparative Example.

FIG. 6 shows the profile of the diffusion of the Mg p-type dopant into the active layer measured by secondary ion mass spectrometry (SIMS) for the laser wafer of the Comparative Example after crystal growth.

As can been seen from FIG. 6, Mg is widely diffused into the active layer (from the third quantum well 20 toward the first quantum well 16). More specifically, the concentrations of Mg diffused into the first quantum well 16, the second quantum well 18, and the third quantum well 20 are about $4E17$ cm$^{-3}$, $2E18$ cm$^{-3}$, and $1E19$ cm$^{-3}$, respectively. As will be described later, the Mg concentration is about 10 times greater and about 4 times greater in the second quantum well 18 and the third quantum well 20, respectively, as compared with the measurement results for the laser wafer of the first embodiment. These results indicate that the diffusion of Mg was encouraged by doping the undoped GaN intermediate layer 21 according to the first embodiment with an Si impurity, which is an n-type impurity (i.e., by forming an n-type GaN intermediate layer).

Based on the prior art publication "Journal of Applied Physics, Vol. 66 (1989): 605–610", the above phenomenon can be explained as follows: Diffused Mg atoms reside in interstitial positions and thus diffuse easily and encounter Si existing in substitutional positions, forming an electrically neutral and stable complex, MgSi, owing to donor-acceptor interaction (i.e., Coulomb interaction). The Mg atoms are thus expected to diffuse easily in the region doped with Si. Accordingly, it is assumed that Mg is diffused in a wide range toward the central portion of the active layer because the barrier layers in the active layer, as well as the intermediate layer, are doped with Si in the Comparative Example.

The semiconductor laser device according to the Comparative Example achieved room-temperature continuous-wave lasing by current injection. The threshold current and slope efficiency were 75 mA and 0.5 W/A, respectively, indicating that both deteriorated as compared with those measured for the semiconductor laser device according to the first embodiment, which were given heretofore. Such deterioration can probably be attributed to the fact that the luminous efficiency of the active layer of the laser device was lowered owing to the diffusion of Mg. The present inventors conducted the following experiment to verify this assumption.

In the experiment, two semiconductor laser devices (Specimens A and B) were prepared in accordance with the manufacturing process for the laser wafer of the first embodiment, Specimen A having an active layer intentionally doped with Mg during its growth and Specimen B having an active layer intentionally not doped with Mg during its growth. In addition, another semiconductor laser device (Specimen C) was prepared in the same manner as in the first embodiment except that, in the process of producing a laser wafer, an Si-doped-GaN active layer was formed and, further, the active layer was intentionally doped with Mg during its growth. The Mg impurity concentrations in Specimens A and C were controlled to be about $1E19$ cm$^{-3}$.

Figure 7:
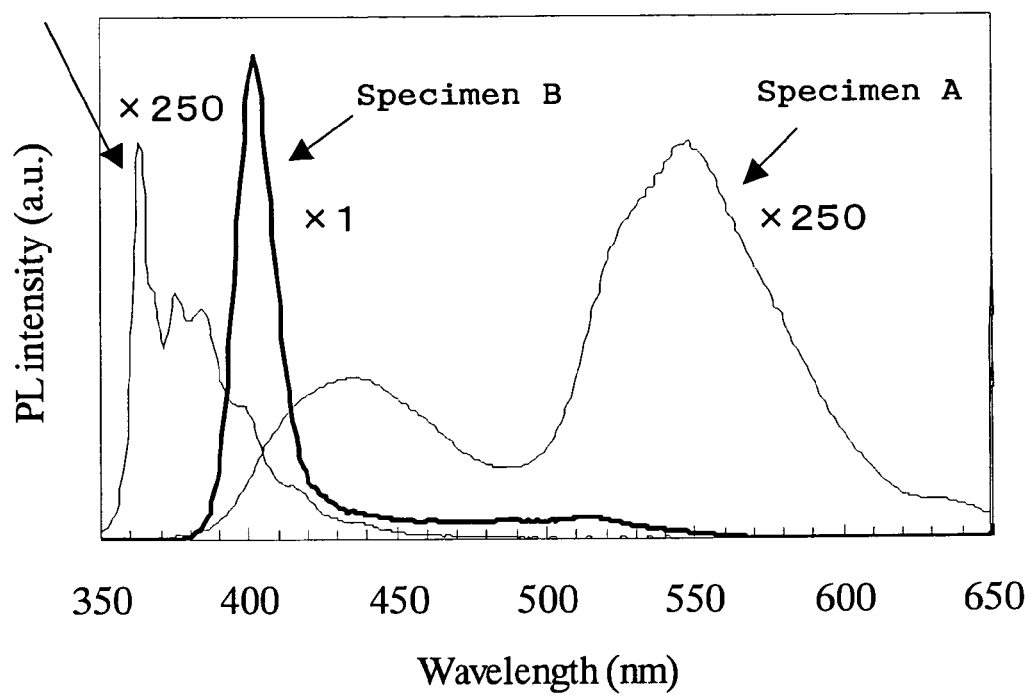
FIG. 7 is a diagram showing the variation of photoluminescence (PL) with respect to wavelength.

Photoluminescence (PL) was measured for each of the above Specimens A to C by selectively photoexciting the active layer at room temperature, the results of which are presented in FIG. 7, where the PL intensities of Specimens A and C are multiplied by 250.

As seen from FIG. 7, Specimen B, which was not doped with Mg, has a PL peak at a wavelength of about 400 nm. In contrast, Specimen A, which was doped with Mg, has two separate peaks at about 435 nm and 550 nm, with a large half-width for each of the peaks. This phenomenon may find an explanation in the assumption that deep levels were formed in the InGaN quantum wells by doping the active layer with Mg, thus forming non-radiative recombination centers, or in the assumption that a phase separation in InGaN was encouraged by doping the active layer with Mg, thus deteriorating the abruptness at the interface between each of the quantum wells and the other layers.

The PL intensity of the emission from deep levels (550 nm) normalized by the peak intensity (i.e., normalized intensity) is 13,600 (550 nm)/1,300,000 (400 nm)=1.1E−2 for Specimen B, which was not Mg-doped, and is 1,045,000 (550 nm)/433,200 (430 nm)=2.4 for Specimen A, which was Mg-doped. These results indicate that Specimen A, having been doped with Mg, has a higher ratio of the emission from deep levels, thus causing a lower luminous efficiency in the active layer.

In contrast, the normalized intensity for Specimen C, whose active layer of Si-doped GaN was doped with Mg, is 12 (550 nm)/16,200 (360 nm)=7.4E−4, making it lower than that for Specimen B, which was not doped with Mg. This measurement demonstrates a problem peculiar to laser devices whose active layer contains an InGaN quantum well, i.e., when they are doped with Mg, the normalized intensity of the emission from deep levels increases, thus resulting in a lower luminous efficiency. The only measure that has been recognized as being effective for extending the lifetime of GaN-based light-emission devices is to reduce the dislocation density and power consumption. What we have found for the first time here is that controlling the impurity concentration in an active layer is also an important approach for extending lifetime, and this is a very significant finding.

In addition, Specimen C represents the semiconductor laser diode produced by Mg-doping the active layer of the gallium nitride-based compound semiconductor laser diode disclosed in the Japanese Unexamined Patent Publication No. 1994-283825. Although the Japanese Unexamined Patent Publication No. 1994-283825 mentions the problem relating to the diffusion of Mg, the invention thereof uses Si-doped GaN for the active layer. As is apparent from our experiment described above, according to the Japanese Unexamined Patent Publication No. 1994-283825, even if Mg is dispersed in the active layer of Si-doped-GaN, the PL intensity reaches its peak at a wavelength of about 360 nm, thus being on the short-wavelength side with respect to the wavelength of about 400 nm, as shown in FIG. 7.

What captures our attention is that, when Mg is dispersed into an active layer of InGaN, as is the case with Specimen A, the PL intensity peak shifts its position to a wavelength around 550 nm, thus being on the long-wavelength side, causing the color of the emitted light to become yellow. The Japanese Unexamined Patent Publication No. 1994-283825 does not address the problem of the PL intensity peak being shifted to the long-wavelength side when viewed from the wavelength of 400 nm, thereby causing the color of the emitted light to become yellow. Consequently, the present invention, while seemingly resembling the invention of the Japanese Unexamined Patent Publication No. 1994-283825, completely differs in respect to the problem to be solved. Furthermore, the Japanese Unexamined Patent Publication No. 1994-283825 does not suggest the possible inclusion of In in an active layer.

Figure 8:
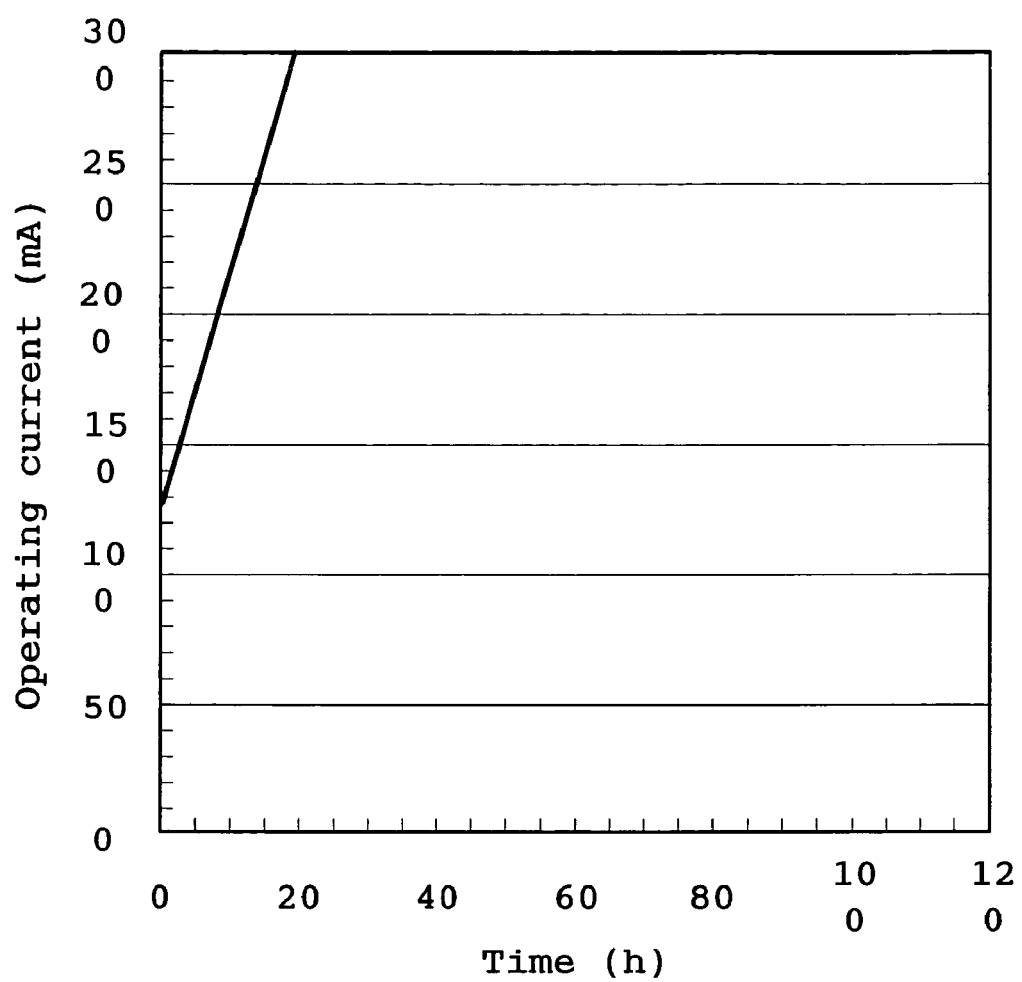
FIG. 8 is a diagram showing the variation of operating current with respect to operating time for a semiconductor laser device according to the Comparative Example.

A semiconductor laser device of the Comparative Example whose power consumption is about 0.6 W at an optical output power of 30 mW was selected and subjected to an automatic power control (APC) lifetime test at an optical output power as high as 30 mW and at room temperature, the results of which are plotted in FIG. 8.

The measurement results presented in FIG. 8, when compared with those obtained for the semiconductor laser device of the first embodiment having the same power consumption (see FIG. 5), demonstrate that the deterioration of the laser device of the Comparative Example (which is about 9 mA per hour) is about 10 times greater than that of the laser device of the first embodiment, thus representing a very rapid degradation. It becomes apparent therefore that the laser device of the Comparative Example and that of the first embodiment are essentially the same in terms of dislocation density (which is about $1E10$ cm$^{-2}$), but vary in terms of lifetime because of the difference in the profile of Mg diffused into the active layer.

The reason why the same power consumption was selected for the above comparison is that, unless laser diodes are compared at essentially the same power consumption, the correlation between the profile of Mg diffused into the active layer and lifetime will not be clearly discernible because the lifetime of a GaN-based laser is highly dependent on the power consumption.

Analysis Concerning the Thickness of the Intermediate Layer

The following analysis relates to the preferred thickness of the intermediate layer 21 of a semiconductor laser according to the present embodiment. According to the present embodiment, the undoped intermediate layer 21 is located between the p-type semiconductor layer and the active layer. Hence, if the intermediate layer 21 is excessively thick, positive holes cannot be efficiently injected from the p-type semiconductor layer into the active layer. As an experiment, a pn junction device was fabricated by stacking an n-type GaN layer and a p-type GaN layer in the same manner as above to thereby determine the diffusion length of the positive holes in the n-type GaN layer. The device was cleaved to expose the pn junction area, the cross-section of which was then examined by means of electron beam induced current (EBIC) using a scanning electron microscope (SEM). The diffusion length of the positive holes in the n-type GaN layer was about 0.2 μm. In Group III-V nitride semiconductors, the positive holes that contribute to electrical conductivity have a higher effective mass than those of other compound semiconductors, so the positive holes diffuse over a very short length of about 0.2 μm or less.

It became clear from such experimental results that the thickness of the intermediate layer 21 needs to be less than the diffusion length of the positive holes (which is 0.2 μm in the present embodiment) in order to allow for a highly efficient electrical injection of positive holes into the active layer.

Figure 9:
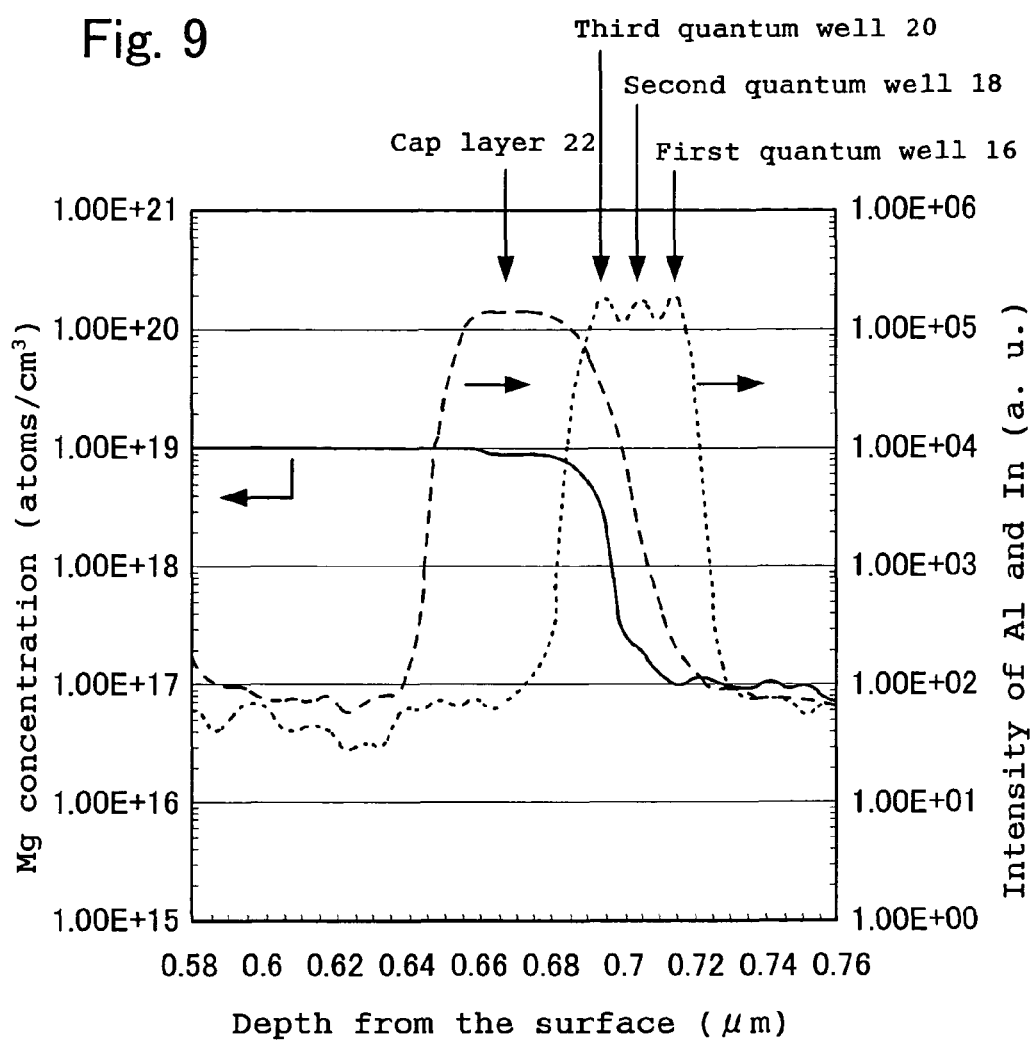
FIG. 9 is a diagram showing the profile of Mg diffusion into an active layer of the laser wafer according to the first embodiment of the present invention.

However, if the intermediate layer 21 is excessively thin, the p-type dopant will penetrate the intermediate layer 21 and diffuse into the active layer. For example, FIG. 9 shows the profile of an Mg p-type dopant diffused into the active layer measured by SIMS for an intermediate layer 21 with a thickness of 15 nm. It is obvious that Mg is diffused into the active layer (from the third quantum well 20 toward the first quantum well 16). More precisely, the concentrations of diffused Mg are about $1E17$ cm$^{-3}$, $2E17$ cm$^{-3}$, and $3E18$ cm$^{-3}$ in the first quantum well 16, the second quantum well 18, and the third quantum well 20, respectively.

For a more detailed analysis, the following experiment was conducted by fabricating a variety of laser devices, each differing in the thickness of the intermediate layer 21. For example, FIG. 10 shows the profile of Mg diffused into the active layer measured by SIMS for a laser wafer having an intermediate layer 21 with a thickness of 60 nm.

Figure 10:
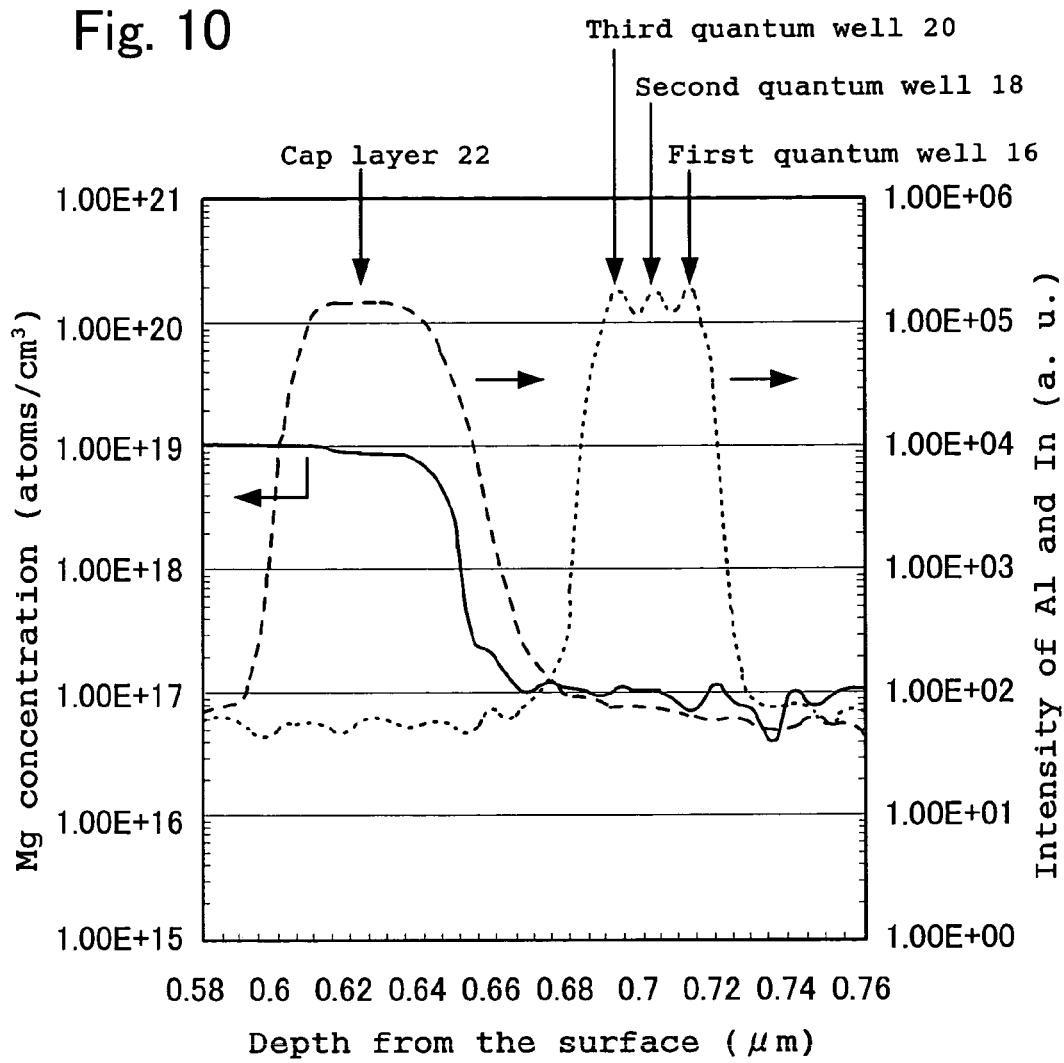
FIG. 10 is a diagram showing the profile of Mg diffusion into an active layer of another laser wafer according to the first embodiment of the present invention.

The results presented in FIG. 10 (for the intermediate layer thickness of 60 nm), when compared with those presented in FIG. 9 (for the intermediate layer thickness of 15 nm), demonstrate that the diffusion of Mg into the active layer (from the third quantum well 20 toward the first quantum well 16) is restricted by the increase in the thickness of the intermediate layer 21. More specifically, the concentration of diffused Mg is about $1E17$ cm$^{-3}$ (i.e., the detectable limit) in each of the first, the second, and the third quantum wells.

As described above, the distance between the p-type $Al_{0.18}Ga_{0.82}N$ cap layer and the active layer is lengthened by the increase in the thickness of the intermediate layer 21, with the result that the diffusion of Mg into the active layer is restricted.

The semiconductor laser device which was fabricated using the laser wafer with the 60-nm-thick intermediate layer achieved room-temperature continuous-wave lasing by current injection. The threshold current and slope efficiency of this laser device were 50 mA and 1.0 W/A, respectively, indicating that both were favorable as compared to the case of the 15-nm-thick intermediate layer. The threshold current and slope efficiency of the laser device with the 30-nm-thick intermediate layer were 55 mA and 0.9 W/A, respectively, also indicating that both were favorable as compared to the case of the 15-nm-thick intermediate layer. It is assumed that these results stem from the fact the diffusion of Mg was restricted by the increase in the thickness of the intermediate layer, thus enabling improved luminous efficiency in the active layer.

According to the APC lifetime test conducted for laser devices with a power consumption of about 0.6 W at an optical output power of 30 mW, the laser device with the 30-nm-thick intermediate layer exhibited a lifetime of about 110 hours and the laser device with the 60-nm-thick intermediate layer exhibited a lifetime of about 125 hours. This result, when compared with that of the laser device with the 15-nm-thick intermediate layer, which is 100 hours, as previously mentioned, demonstrates that lifetime is extended by an increase in the thickness of the intermediate layer, but not to a significant degree. To determine the cause of this problem, the laser device with the 60-nm-thick intermediate layer that had undergone the APC lifetime test was further subjected to a SIMS analysis, the results of which are shown in FIG. 11.

Figure 11:
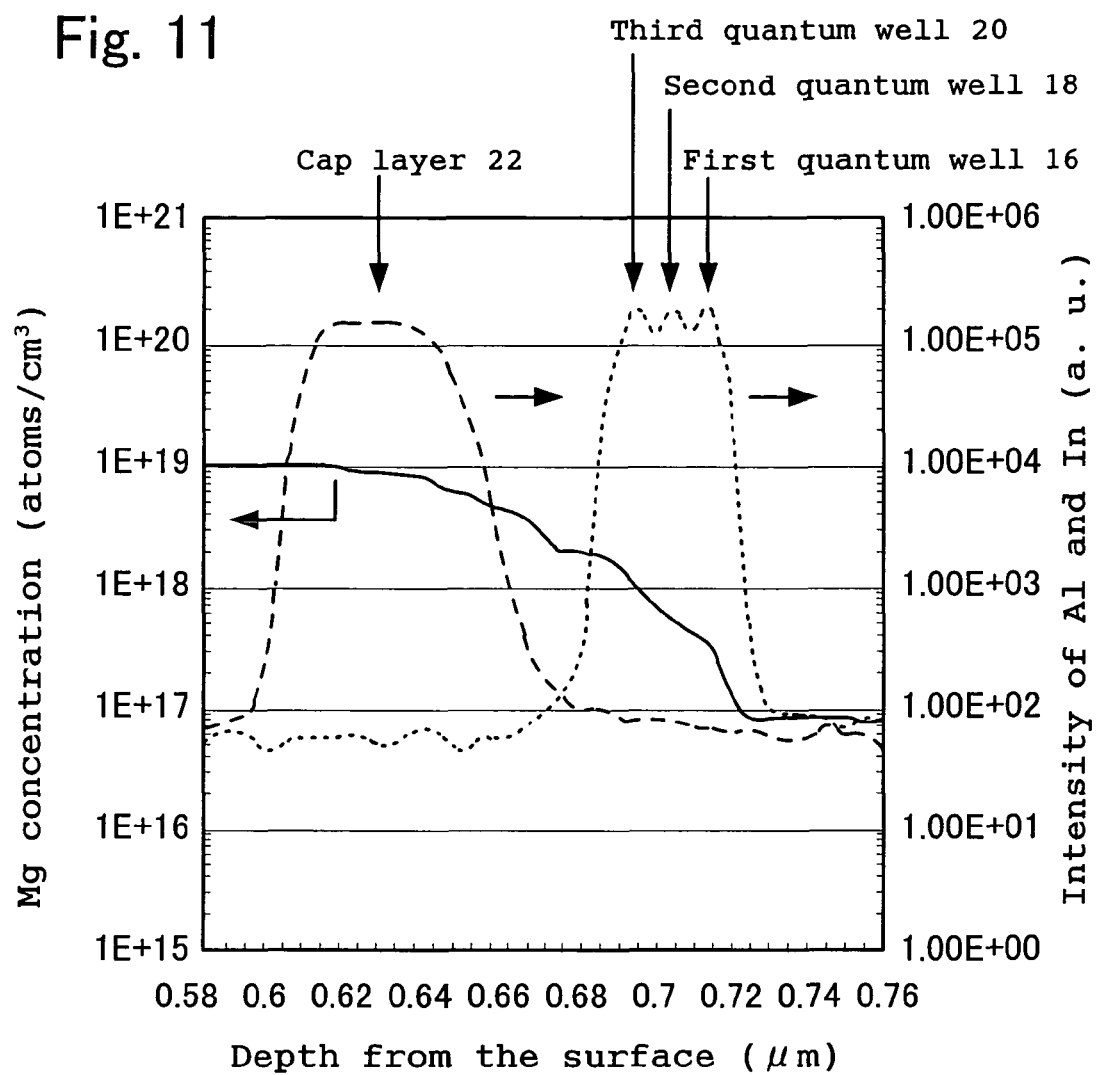
FIG. 11 is a diagram showing the profile of Mg diffusion into the active layer measured after a lifetime test for the above-mentioned other laser wafer according to the first embodiment of the present invention.

The SIMS results presented in FIG. 11, when compared to those obtained before the APC lifetime test (FIG. 10), demonstrate that the lifetime test caused a significant diffusion of Mg into the active layer. This phenomenon probably finds an explanation in the assumption that the high dislocation density (of about $1E10$ cm$^{-2}$) caused the generation of heat and internal electrical fields, causing the Mg p-type dopant to diffuse into the active layer through the dislocations.

Figure 12:
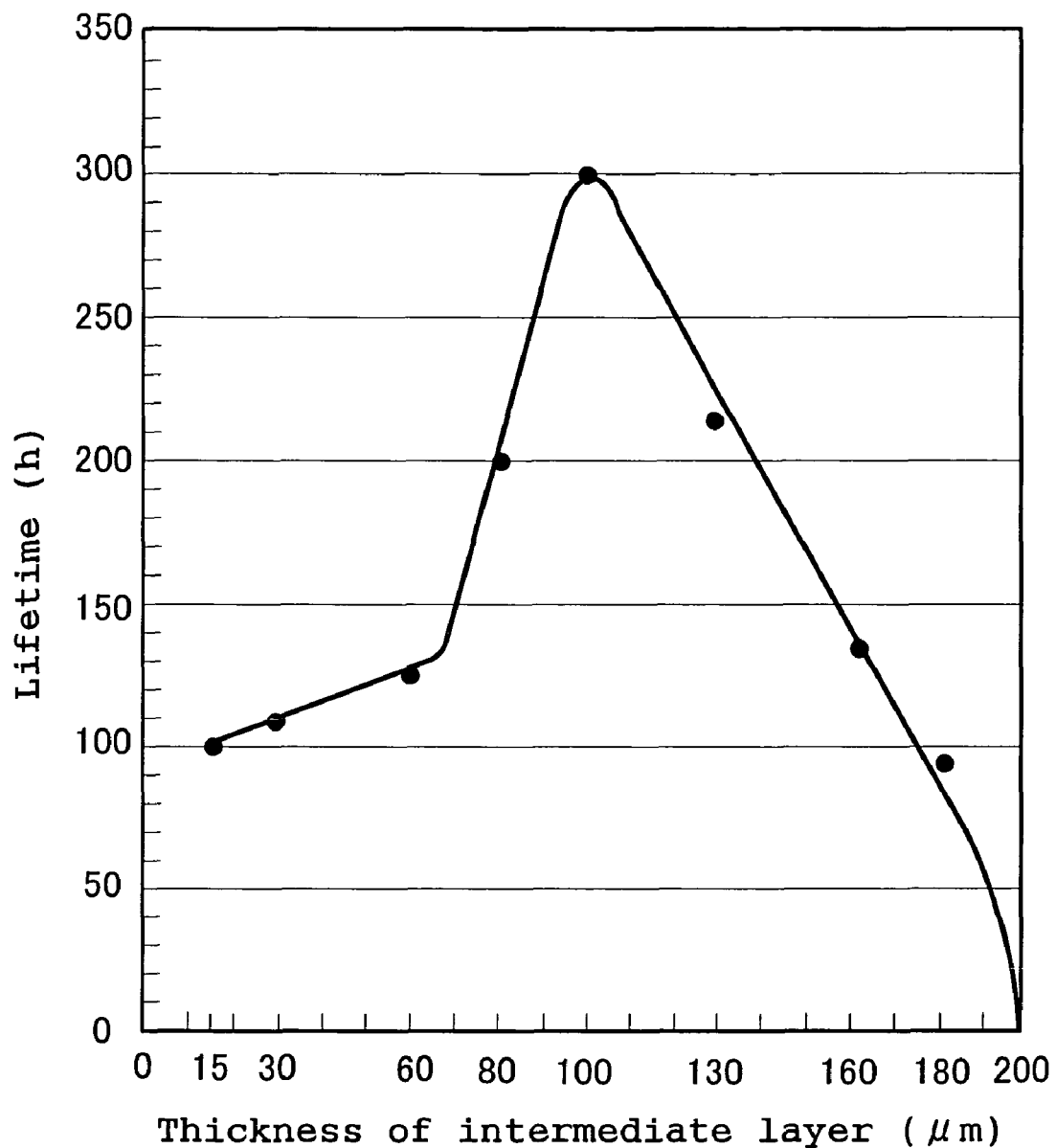
FIG. 12 is a diagram showing the relationship between lifetime and the thickness of the intermediate layer for the first embodiment of the present invention.

It was discovered, however, that a further increase in the thickness of the intermediate layer 21 dramatically improved the lifetime. FIG. 12 shows the results of APC tests conducted for various laser devices, each differing in the thickness of the intermediate layer 21. As regards the laser devices having an intermediate layer of up to about 100 nm in thickness, the thicker the intermediate layer is, the longer the lifetime becomes. However, once the thickness of the intermediate layer exceeds 100 nm, the lifetime is shortened gradually with an increase in thickness. A laser device with an intermediate layer of 200 nm (0.2 μm) in thickness was also fabricated, but did not achieve room-temperature continuous-wave lasing, supposedly because the thickness of the intermediate layer was approximately equal to the diffusion length of the positive holes (0.2 μm), with the result that the efficiency with which the positive holes were injected into the active layer was greatly reduced.

Given the above results, it is preferable that the thickness of the intermediate layer 21 be not less than 15 nm and not more than 180 nm, more preferably not less than 60 nm and not more than 160 nm, and even more preferably not less than 80 nm and not more than 130 nm.

Subsequently, in order to determine the light-emitting properties of the laser devices, electroluminescent (EL) light emitted along the ridge stripe by current injection was observed from the rear side of the sapphire substrate using a charge coupled device (CCD) camera. The EL light emitted from the laser device with the 15-nm-thick intermediate layer showed numerous areas with low intensity (i.e., variability in light emission), while the EL light emitted from the laser device with the 30-nm-thick or 60-nm-thick intermediate layer showed uniformity. The problem of variability in light emission mentioned above has been previously reported, for example, in Publication No. 7, "48$^{th}$ Technical meeting of the Japan Society of Applied Physics and Related Societies (Oyobutsurigakukankei Rengokoenkai), Digest No. 1, 28p-E-12, p. 369". This publication attributes the cause of the variability in light emission to dynamic distortion caused in the active layer due to the p-type AlGaN cap layer existing above the active layer. In contrast, our analysis led us to the novel discovery that the main reason for the variability in light emission is the diffusion of Mg into the active layer. This finding is very significant also from the perspective of manufacturing because a reduction in the variability in light emission should contribute considerably to a higher yield of laser devices per wafer surface and ultimately to lower costs.

Also, the EL image of the laser device with the 60-nm-thick intermediate layer was examined both before and after the APC lifetime test for comparison. Before the lifetime test, a number of dark points were found which were attributable to threading dislocations, and, after the lifetime test, it was found that the dark points tended to be darker (enlarged). As described earlier, it is presumed that this phenomenon is caused by the diffusion of Mg through the threading dislocations during the lifetime test, thus degrading the luminous efficiency in the region around the dislocations in the active layer.

(Second Embodiment)

Figure 13:
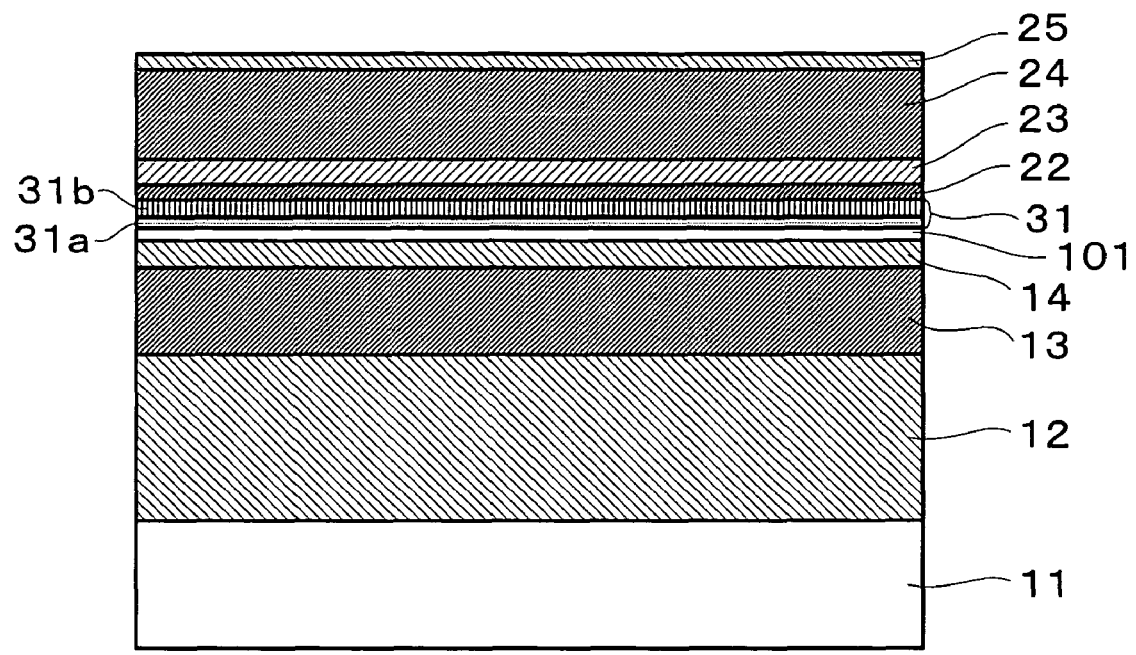
FIG. 13 is a cross-sectional view of a laser wafer constituting a semiconductor laser according to the second embodiment of the present invention.

FIG. 13 is a cross-sectional view of a laser wafer constituting a semiconductor laser according to the second embodiment of the present invention. The laser wafer according to the second embodiment is structurally identical to that of the first embodiment, shown in FIG. 1, except that the undoped intermediate layer 21 according to the first embodiment is replaced by an intermediate layer 31, which has a stacked structure composed of two layers. Accordingly, the equivalent structural elements are represented by the same reference numerals as in the first embodiment. The detailed explanations concerning the equivalent elements are also omitted.

In the laser wafer of the present embodiment, the intermediate layer 31 is a GaN layer with a thickness of 60 nm, which is formed between an active layer 101 and a cap layer 22 and which has a stacked structure composed of an undoped layer 31a with a thickness of 15 nm and a diffusion-blocking layer 31b with a thickness of 45 nm. The diffusion-blocking layer 31b has an Si impurity concentration of, for example, about 3E19 cm$^{-3}$, and adjoins the cap layer 22.

The laser wafer of the present embodiment may be manufactured in the same manner as in the first embodiment except that, in the course of forming the intermediate layer 31, the amount of SiH$_4$ gas provided is varied during the growth of the GaN layer so as to produce an uneven distribution of Si impurity concentration in the thickness direction of the intermediate layer 31. More specifically, the intermediate layer 31 is grown such that the first 15 nm is left undoped and the remaining 45 nm is provided with SiH$_4$ gas to thereby form an n-type GaN layer.

Figure 14:
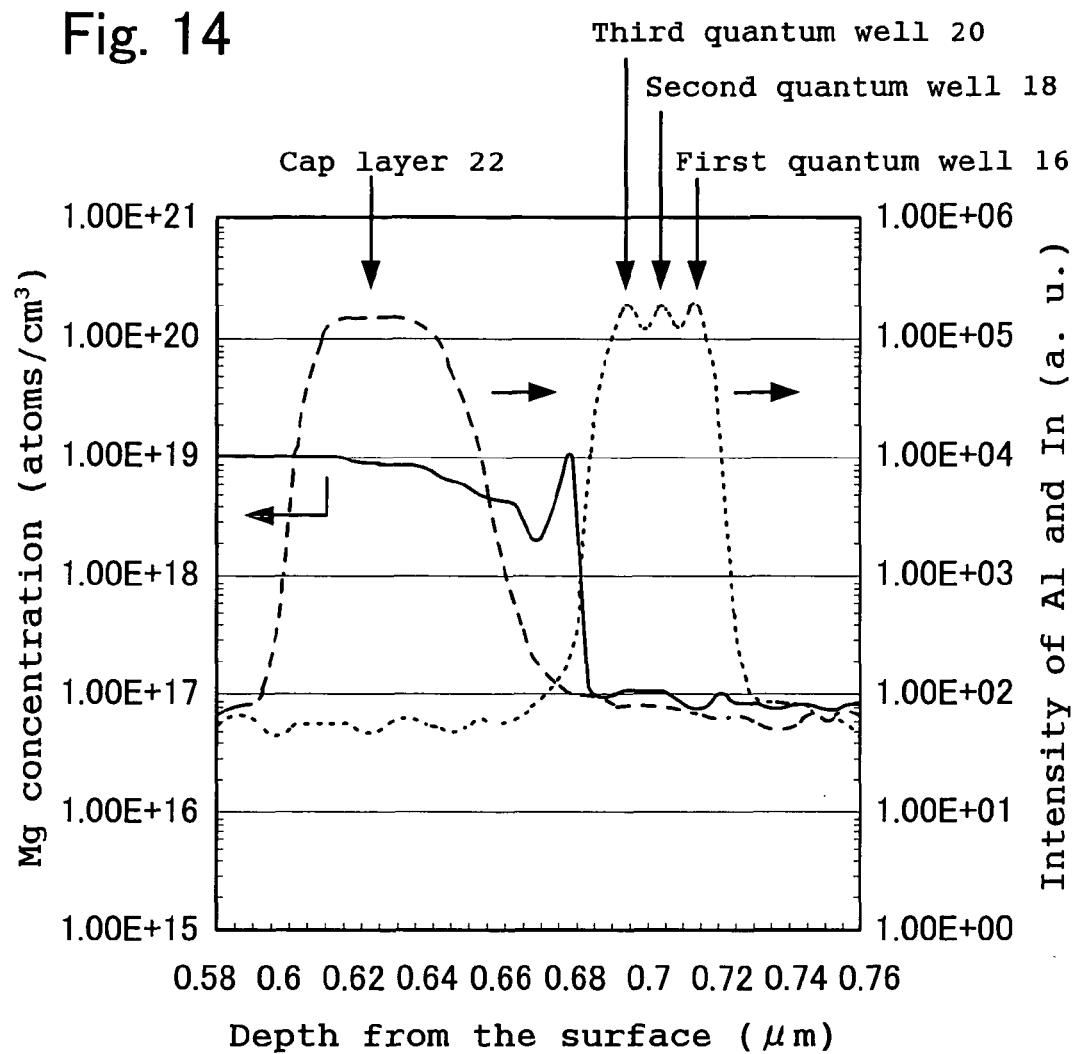
FIG. 14 is a diagram showing the profile of Mg diffusion into an active layer of the laser wafer according to the second embodiment of the present invention.

FIG. 14 shows the profile of the diffusion of the Mg p-type dopant into the active layer measured by SIMS for a laser wafer after crystal growth. It is obvious that, according to the present embodiment, the diffusion of Mg into the active layer is significantly restricted because of the intermediate layer 31 existing immediately under the p-type Al$_{0.18}$Ga$_{0.82}$N cap layer 22, at which point the Mg doping began. More specifically, the concentration of diffused Mg is about 1E17 cm$^{-3}$ (i.e., the detectable limit) in each of a first quantum well 26, a second quantum well 28 and a third quantum well 30.

The above measurement results, when compared with those obtained for the laser wafer of the first embodiment 1 whose intermediate layer 21 has essentially the same thickness as the total thickness of the intermediate layer 31 (about 60 nm) according to the present embodiment (see FIG. 10), demonstrate that the Mg concentration in the active layer is about the same in both of the embodiments although the Mg concentration in the intermediate layer is higher in the present embodiment, supposedly because of the following reasons.

Diffused Mg atoms reside in interstitial positions and thus diffuse easily and encounter Si existing in substitutional positions, forming an electrically neutral and stable complex, MgSi, owing to donor-acceptor interaction (i.e., Coulomb interaction). The Mg atoms are therefore expected to diffuse into the region doped with Si and stabilize therein. According to the present embodiment, the approximately 45-nm-thick region that is formed later in the growth of the intermediate layer 31 constitutes a diffusion-blocking layer 31b that is doped with Si to a concentration of about 3E19 cm$^{-3}$, so the Mg atoms accumulate (pile up) at the interface between the diffusion-blocking layer 31b and the p-type Al$_{0.18}$Ga$_{0.82}$N cap layer 22. Accordingly, the diffused Mg atoms are concentrated at the above interface and are therefore substantially prevented from diffusing into the active layer. Furthermore, the approximately 15-nm-thick region that is formed early in the growth of the intermediate layer 31, i.e., the undoped layer 31a, prevents the Si that is later added in the growth of the intermediate layer 31 from diffusing into the third quantum well 20.

The semiconductor laser device of the present embodiment achieved room-temperature continuous-wave lasing by current injection. The threshold current and slope efficiency were 45 mA and 1.2 W/A, respectively, thus being favorable, conceivably because of the improved luminous efficiency of the active layer in the laser device owing to the restriction of Mg diffusion.

Figure 15:
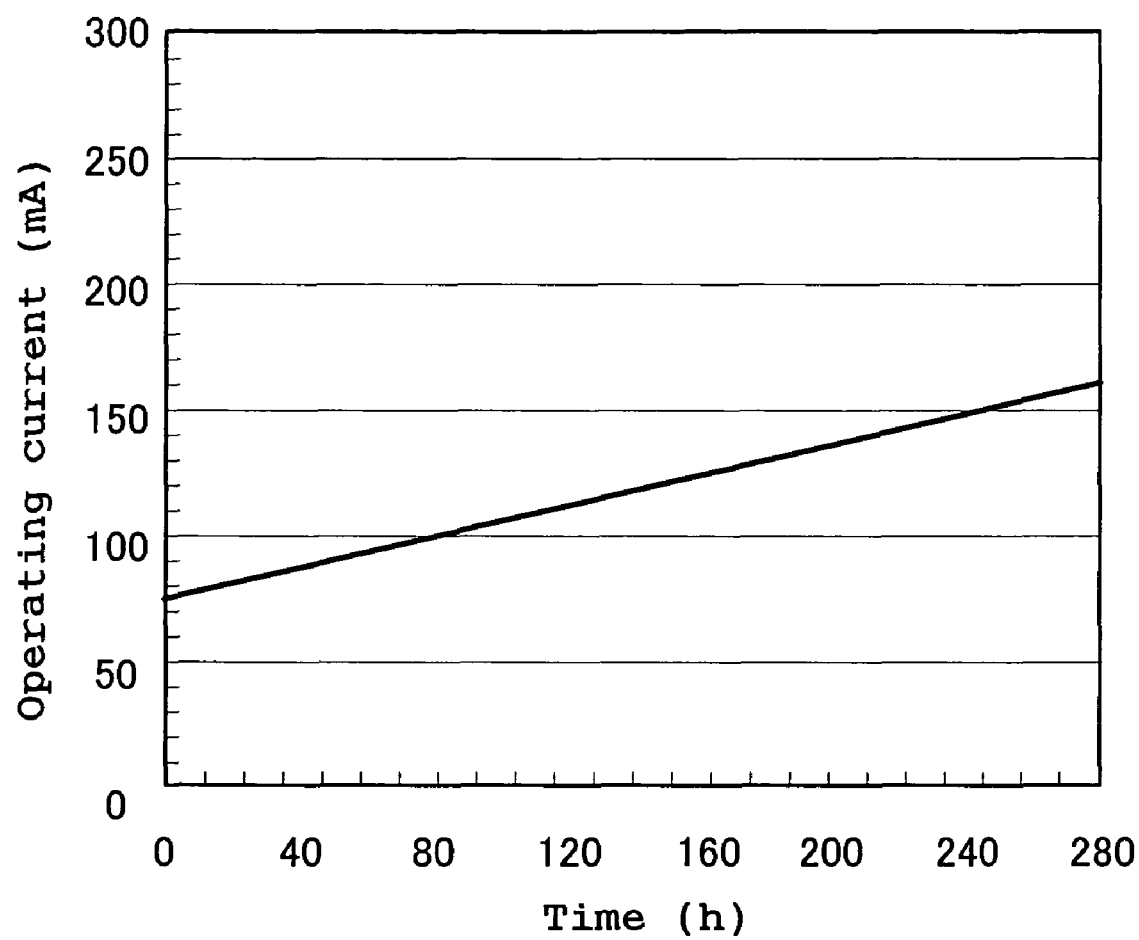
FIG. 15 is a diagram showing the variation of operating current with respect to operating time for a semiconductor laser device according to the second embodiment of the present invention.

Further, as in the first embodiment, a laser device whose power consumption is about 0.6 W at an optical output power of 30 mW was selected and subjected to an APC lifetime test at 30 mW and at room temperature, the results of which are shown in FIG. 15. The laser device had a deterioration rate of about 0.3 mA per hour and a lifetime of about 250 hours.

The above results, when compared to those obtained for the laser device of the first embodiment whose undoped intermediate layer 21 has essentially the same thickness as the total thickness of the intermediate layer 31 (about 60 nm) according to the present embodiment, demonstrate that the laser device of the present embodiment provides a longer lifetime than that of the laser device of the first embodiment, which is about 125 hours.

According to the present embodiment, the intermediate layer is composed of GaN, which is a binary mixed crystal. However, other gallium nitride-based compound semiconductors are also possible, including ternary mixed crystals, such as AlGaN or InGaN, and quaternary mixed crystals, such as AlInGaN. In addition, while Group III-V nitride semiconductor lasers have been explained in the present embodiment, Group III-V semiconductor lasers that comprise GaAs or InP and Group II-VI semiconductor lasers that comprise ZnSe may also be configured in the same manner as in the present embodiment.

Analysis Concerning the Si Concentration in the Intermediate Layer

The following analysis relates to the favorable concentration of Si in the diffusion-blocking layer 31b of the intermediate layer 31. In accordance with the method of the present embodiment, three types of laser wafers (Specimens D, E and F) were fabricated, each varying in terms of the Si concentration in the intermediate layer 31. The Si concentration in the diffusion-blocking layer 31b of each of Specimens D, E, and F was controlled to be about 5E17 $cm^{-3}$, about 2E18 $cm^{-3}$, and about 1E19 $cm^{-3}$, respectively. The Si concentration of about 2E18 $cm^{-3}$ is essentially equal to the Si concentration in the barrier layer of the active layer, while the Si concentration of about 1E19 $cm^{-3}$ is essentially equal to the Mg concentration in the p-type $Al_{0.18}Ga_{0.82}N$ cap layer.

Figure 16:
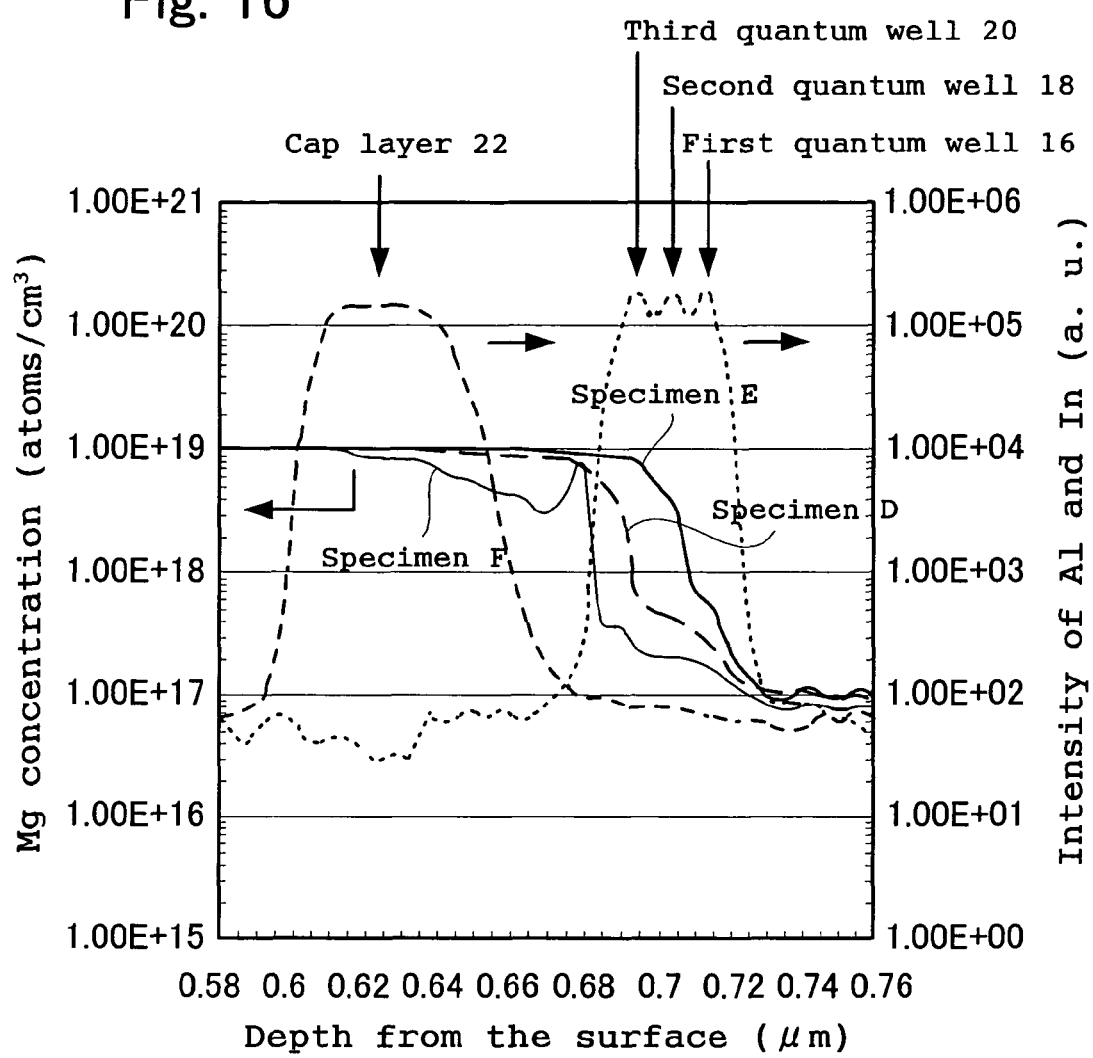
FIG. 16 is a diagram showing the profile of Mg diffusion into an active layer of another laser wafer according to the second embodiment of the present invention.

Each of Specimens D, E and F was examined in terms of the profile of Mg diffusion into the active layer by means of SIMS, the results of which are shown in FIG. 16. It is obvious that Mg is diffused into the active layer (from the third quantum well 20 toward the first quantum well 16) in all of the examined Specimens. However, while the degree of Mg diffusion is most significant in Specimen E, it is inhibited in Specimen D, and more inhibited in Specimen F. Particularly in specimen F, an accumulation (piling-up) of Mg is seen, thus indicating an effective prevention of Mg diffusion.

From the above results, it was discovered that the diffusion of Mg is noticeably restricted by controlling the Si concentration in the diffusion-blocking layer 31b of the intermediate layer 31 to be about the same or higher than the Mg concentration in the p-type $Al_{0.18}Ga_{0.82}N$ cap layer 22 (which is about 1E19 $cm^{-3}$ in the present embodiment). As a general tendency, even when Group III-V nitride-based compound semiconductors are doped with a p-type impurity, their p-type semiconductor layer has low electrical conductivity because the electrical activation of the p-type impurity is only on the scale of a few percent. In order to improve the electrical conductivity of the p-type semiconductor layer, the concentration of positive-holes that contribute to electrical conductivity needs to be about 1E18 $cm^{-3}$, meaning that high-volume doping with the p-type impurity should be used to bring the p-type impurity concentration to 1E19 $cm^{-3}$ or higher in consideration of the electrical activation rate. In such a case, the p-type impurity can be efficiently prevented from diffusing outside the p-type semiconductor layer by controlling the n-type impurity concentration in the diffusion-blocking layer 31b to be 1E19 $cm^{-3}$ or higher. The upper limit of the Si concentration in the diffusion-blocking layer 31b may be any value as long as it is within the practical range, e.g., about 6E19 $cm^3$.

Analysis Concerning the Thickness of Each of the Layers Constituting the Intermediate Layer According to the present embodiment, the undoped layer 31a and the diffusion-blocking layer 31b in the intermediate layer 31 (that is 60 nm in total thickness) have a thickness of 15 nm and 45 nm, respectively. For the purpose of analysis, however, the ratio of the thickness of the diffusion-blocking layer 31b to that of the undoped layer 31a was appropriately varied, and the diffusion of Mg into the active layer was examined for various laser wafers. The Si concentration in the diffusion-blocking layer 31b was controlled to be about 1E19 $cm^{-3}$.

According to the results of the above, it was found that, assuming the thickness of the undoped layer 31a to be 1, the diffusion of Mg can be effectively restricted when the thickness of the diffusion-blocking layer 31b is not less than $1/11$ and not more than 11, and can be more effectively restricted when the above thickness is not less than $1/3$ and not more than 3. It is, however, preferred that the total thickness of the intermediate layer 31 be equal to or smaller than the diffusion length of the positive holes, or more specifically not less than 15 nm and not more than 180 nm, as is the case with the first embodiment.

(Third Embodiment)

Figure 17:
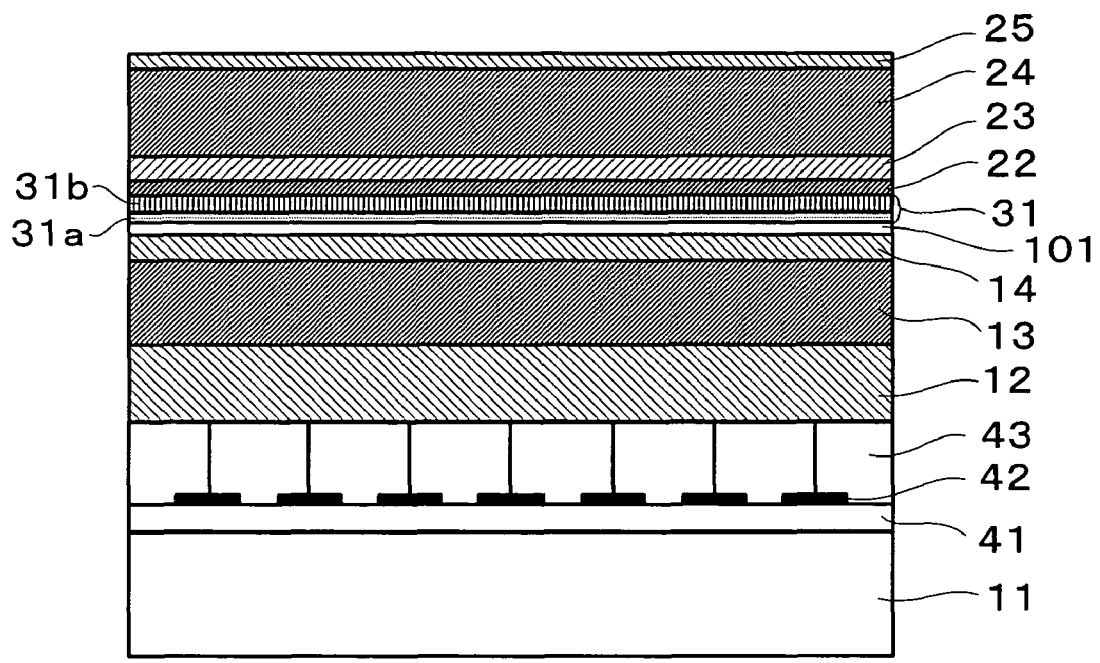
FIG. 17 is a cross-sectional view of a laser wafer constituting a semiconductor laser according to the third embodiment of the present invention.

FIG. 17 is a cross-sectional view of a laser wafer constituting a semiconductor laser according to the third embodiment of the present invention. The semiconductor laser of the third embodiment is structurally identical to that of the second embodiment, shown in FIG. 13, except that a first GaN layer 41 is formed on a substrate 11, a stripe-like insulating pattern 42 is formed on the first GaN layer 41, and a second GaN layer 43 is formed on the first GaN layer 41 by means of ELO (Epitaxial Lateral Overgrowth) so as to cover the insulating pattern 42. An n-type contact layer 12 is formed on the second GaN layer 43. The equivalent elements are therefore represented by the same reference numerals as in the second embodiment. The detailed explanations concerning the equivalent elements are also omitted. In the present embodiment, the thickness of the n-type contact layer 12 is about 2 μm.

Figure 18:
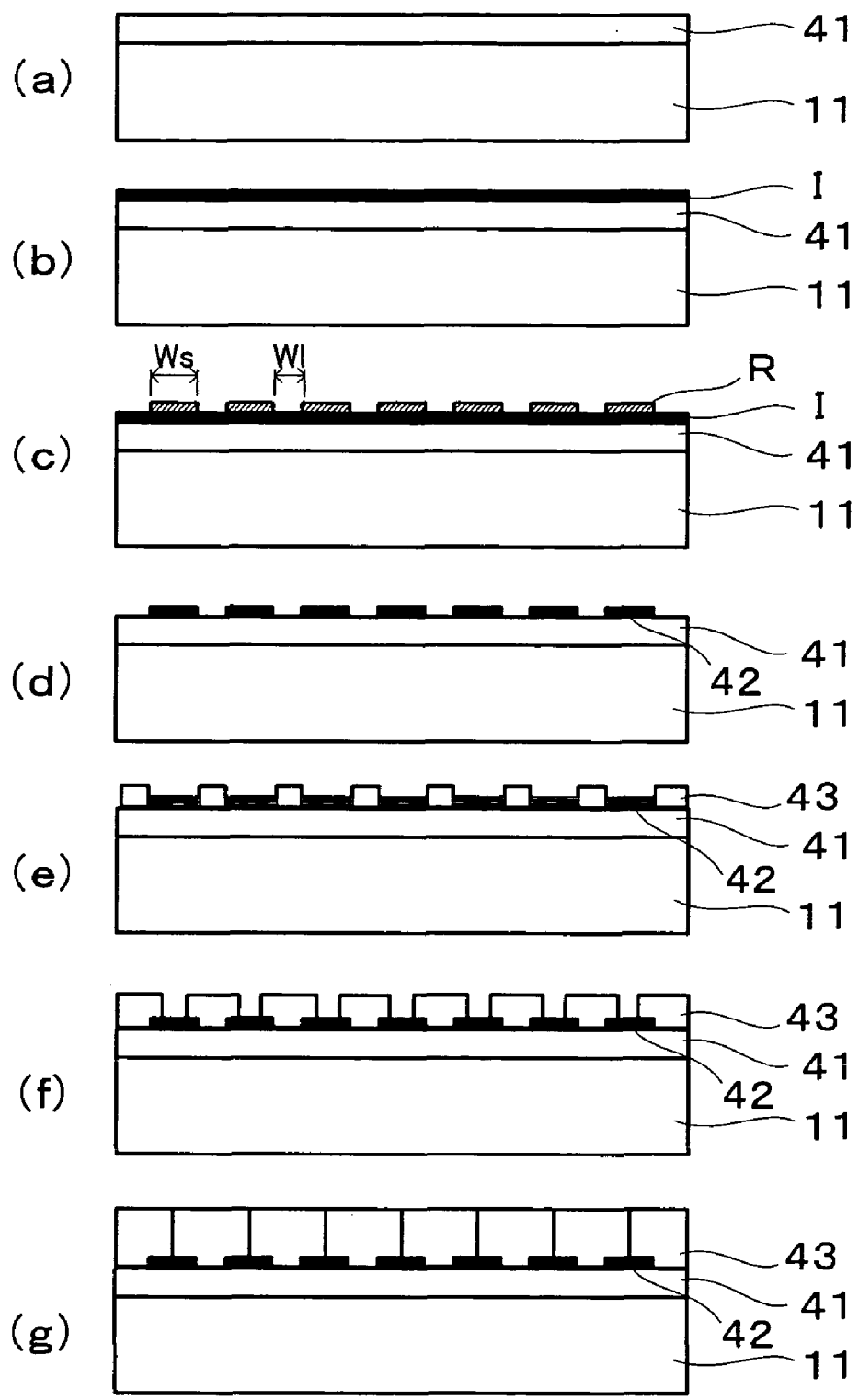
FIG. 18 is a flow diagram illustrating a process for manufacturing the semiconductor laser according to the third embodiment of the present invention.

The semiconductor laser of the present embodiment may be manufactured in basically the same manner as in the second embodiment. The manufacturing process is described below with reference to FIG. 18, focusing mainly on the method for forming the second GaN layer 43 by means of ELO.

A low-temperature buffer layer (omitted from the drawing) is first grown on the substrate 11. Thereafter, the temperature in the reaction chamber is raised to about 1,000° C., and then the first GaN layer 41 is grown to a thickness of about 1 μm (FIG. 18(a)). After this, the substrate 11 is removed from the reaction chamber and, thereafter, an insulating film I, which will be used for selective growth, is formed on the first GaN layer 41 (FIG. 18(b)). This insulting film I is formed by depositing silicon dioxide ($SiO_2$) to a thickness of about 100 nm using a plasma CVD system.

Subsequently, a resist film is applied to the insulating film I and, using a photolithography process, a line-and-space resist pattern R is formed (FIG. 18(c)) such that the line width (Ws) is 15 μm and the space width (W1) is 3 μm and that the stripes are aligned in the <1–100> direction of the first GaN layer 41. Thereafter, the portion of the insulating film I having had the resist removed is etched using a hydrofluoric acid solution, thereby exposing the first GaN layer 41. Then, the resist pattern R is removed using an organic solution, such as acetone, whereby the insulating pattern 42 is formed on the first GaN layer 41 (FIG. 18(d)).

Thereafter, the substrate 11 is again placed on the susceptor in the reaction chamber of the MOVPE apparatus, followed by evacuation of the reaction chamber. Then, the inside of the reaction chamber is controlled to provide a hydrogen atmosphere with a pressure of 200 Torr and heated to a temperature of about 1,000° C., after which 7 sccm of trimethylgallium (TMG), 7.5 slm of ammonia ($NH_3$) gas, and hydrogen as a carrier gas are provided simultaneously, thereby selectively growing the second GaN layer 43 by ELO. The second GaN layer 43 initially grows between the lines of the insulating pattern 42 (FIG. 18(e)) but, it progressively grows laterally over the insulating pattern 42 (FIG. 18(f)), ultimately forming a flat surface (FIG. 18(g)).

The density of threading dislocations in the second GaN layer 43, as determined by a plan-view transmission electron microscope (TEM) image, was about 1E10 $cm^{-2}$ in the regions sandwiched between the adjacent lines of the insulating pattern 42, and about 5E8 $cm^{-2}$ in the ELO regions formed over the insulating pattern 42. It was therefore found that the dislocation density could be reduced to about 1/20 by ELO selective growth.

During the crystal growth of the laser structure, silane (SiH$_4$) gas is also provided as an n-type dopant over the second GaN layer 43, which is about 5 µm thick, thereby forming the n-type contact layer 12 of n-type GaN, which has a thickness of about 2 µm and an Si impurity concentration of about 1E18 cm$^{-3}$. After this, the same procedure as in the second embodiment can be followed to fabricate the laser wafer shown in FIG. 17.

The laser processing process in which the above laser wafer is processed to produce semiconductor laser devices is identical to that of the first embodiment, except that the ridge of a p-type contact layer 25 is formed immediately over the insulating pattern 42 in the region with low dislocation density.

The laser device of the present embodiment achieved room-temperature continuous-wave lasing by current injection. The threshold current and slope efficiency were 35 mA and 1.4 W/A, respectively, thus being favorable. This positive result is attributable to the improved luminous efficiency in the active layer of the laser device due to the restriction of Mg diffusion, as well as to the reduction in the dislocation density of the active layer region. In other words, the lower dislocation density in the active layer reduced the number of non-radiative recombination centers to improve the luminous efficiency.

Figure 19:
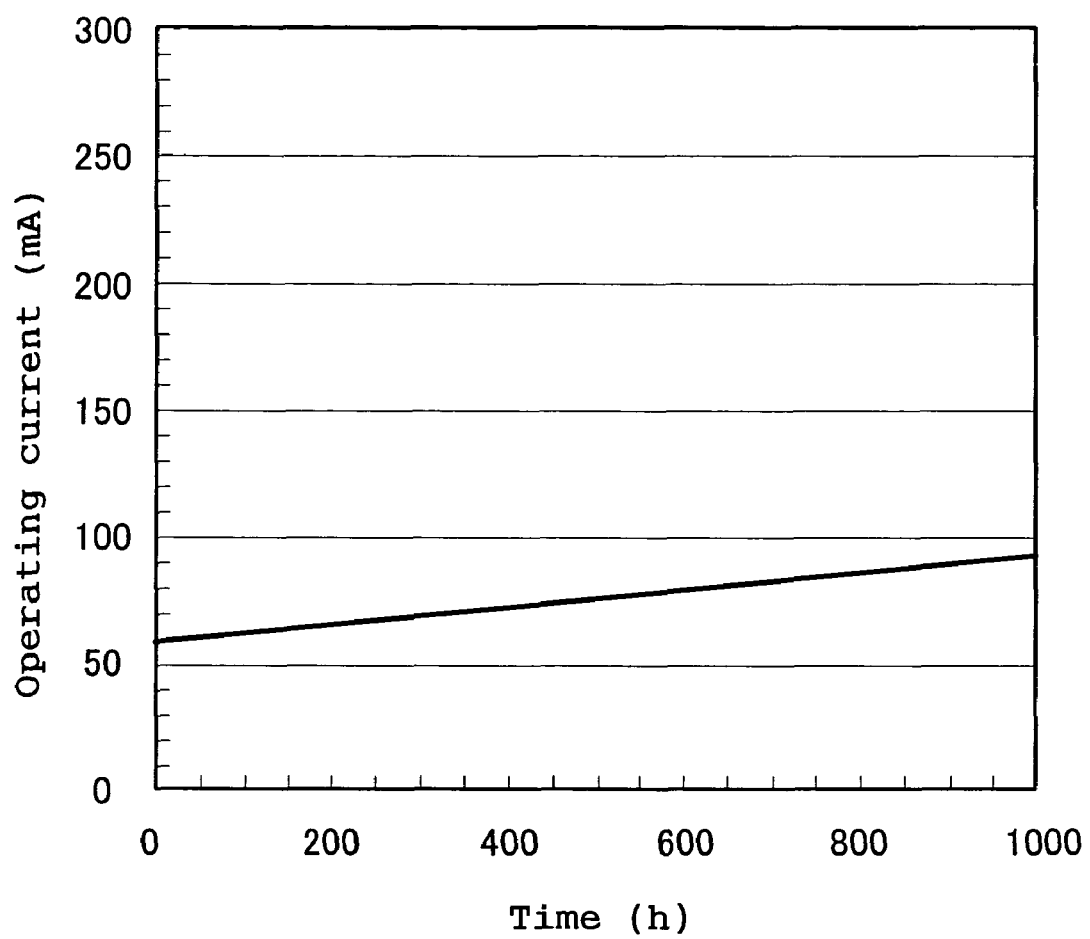
FIG. 19 is a diagram showing the variation of operating current with respect to operating time for a semiconductor laser device according to the third embodiment of the present invention.

As in the first embodiment above, a laser device whose power consumption is about 0.6 W at an optical output power of 30 mW was selected and subjected to an APC lifetime test at 30 mW and at room temperature, the results of which are shown in FIG. 19. The laser device showed a deterioration rate of about 0.03 mA per hour and demonstrated stable operation over a lifetime of at least 1,000 hours, indicating that the progression of deterioration was considerably hindered. These results indicate that the reduction in dislocation density is an important approach for extending the lifetime of GaN-based light-emitting devices, but this approach produces more significant lifetime-lengthening effects when combined with a configuration such as that of the laser device of the first embodiment or the second embodiment, which makes it possible to control the impurity concentration in the active layer.

According to the present embodiment, the intermediate layer is composed of GaN, which is a binary mixed crystal. However, other gallium nitride-based compound semiconductors can also be used, including ternary mixed crystals, such as AlGaN or InGaN, and quaternary mixed crystals, such as AlInGaN. In addition, while Group III-V nitride semiconductor lasers have been explained in the present embodiment, Group III-V semiconductor lasers that comprise GaAs or InP and Group II-VI semiconductor lasers that comprise ZnSe may also be configured in the same manner.

INDUSTRIAL APPLICABILITY

As described above, the present invention provides a semiconductor laser which has an extended lifetime under high optical output power conditions, and a process for manufacturing the same.

The invention claimed is:

1. A semiconductor laser in which an n-type semiconductor layer, an active layer, and a p-type semiconductor layer are stacked in this order on a substrate;
the semiconductor laser comprising an intermediate layer sandwiched between the active layer and the p-type semiconductor layer and composed of a gallium nitride-based compound semiconductor;
the intermediate layer having a stacked structure comprising an undoped layer including no intentionally added impurities and a diffusion-blocking layer doped with an n-type impurity and substantially not doped with a p-type impurity; and the diffusion-blocking layer being located at a side adjacent to the p-type semiconductor layer; wherein the concentration of the n-type impurity in the diffusion-blocking layer is not lower than about 1E19 cm$^{-3}$ and not higher than about 6E19 cm$^{-3}$.

2. A semiconductor laser according to claim 1, wherein the concentration of the n-type impurity in the diffusion-blocking layer is about the same or higher than that of the p-type impurity in the p-type semiconductor layer.

3. A semiconductor laser according to claim 1, wherein the semiconductor laser is a Group III-V nitride semiconductor laser, the n-type semiconductor layer contains Si as an n-type impurity, and the p-type semiconductor layer contains Mg as a p-type impurity.

4. A semiconductor laser according to claim 1, wherein, assuming that the thickness of the undoped layer is 1, the thickness of the diffusion-blocking layer is not less than 1/11 and not more than 11.

5. A semiconductor laser according to claim 4, wherein the thickness of the intermediate layer is not less than 15 nm and not more than 180 nm.

6. A semiconductor laser according to claim 1, wherein the active layer comprises a well layer composed of InGaN.

7. A process for manufacturing a semiconductor laser, comprising the steps of:
forming on a substrate an n-type semiconductor layer doped with an n-type impurity;
forming on the n-type semiconductor layer an active layer comprising a well layer composed of InGaN;
forming on the active layer an intermediate layer composed of a gallium nitride-based compound; and
forming on the intermediate layer a p-type semiconductor layer doped with a p-type impurity,
wherein the step of forming the intermediate layer comprises the steps of growing a gallium nitride-based compound semiconductor layer without adding any impurities, thereby forming an undoped layer including no intentionally added impurities, and starting to add an n-type impurity without adding a p-type impurity in the course of the growth of the gallium nitride-based compound semiconductor layer, thereby forming a diffusion-blocking layer; and wherein the concentration of the n-type impurity in the diffusion-blocking layer is not lower than about 1E19 cm$^{-3}$ and not higher than about 6E19 cm$^{-3}$.

8. A process for manufacturing the semiconductor laser according to claim 7, wherein the step of forming the n-type semiconductor layer on the substrate is performed after selectively growing a nitride-based compound semiconductor layer in the lateral direction on the substrate.

* * * * *